(12) United States Patent
Pataky

(10) Patent No.: US 10,102,320 B2
(45) Date of Patent: Oct. 16, 2018

(54) PREDICTIVE MULTI-USER CLIENT-SERVER ELECTRONIC CIRCUIT DESIGN SYSTEM UTILIZING MACHINE LEARNING TECHNIQUES

(71) Applicant: Autodesk, Inc., San Rafael, CA (US)

(72) Inventor: Edward Sandor Pataky, San Francisco, CA (US)

(73) Assignee: AUTODESK, INC., San Rafael, CA (US)

( * ) Notice: Subject to any disclaimer, the term of this patent is extended or adjusted under 35 U.S.C. 154(b) by 0 days.

(21) Appl. No.: 15/055,279

(22) Filed: Feb. 26, 2016

(65) Prior Publication Data

US 2016/0253445 A1 Sep. 1, 2016

Related U.S. Application Data

(60) Provisional application No. 62/121,391, filed on Feb. 26, 2015.

(51) Int. Cl.
*G06F 17/50* (2006.01)

(52) U.S. Cl.
CPC ........ *G06F 17/5022* (2013.01); *G06F 17/505* (2013.01)

(58) Field of Classification Search
CPC ............ G06F 17/5036; G06F 17/5081; G06F 17/5068; G06F 17/5077; G06F 17/5072; G06F 17/505; G06F 19/22; G06F 19/24; G06F 19/28; G06F 17/5009; G06F 2217/12; G06F 2217/82; G06F 2217/78; G06F 17/5022; G06F 17/5031; G06F 17/5045; G06F 2217/84; G06F 17/5063; G06F 2217/08; H01L 21/28525; H01L 27/11582; Y02P 90/265
USPC .................................................. 716/100–108
See application file for complete search history.

(56) References Cited

U.S. PATENT DOCUMENTS

| | | | |
|---|---|---|---|
| 6,530,065 B1 | 3/2003 | McDonald | |
| 6,910,025 B2 | 6/2005 | Cao | |
| 8,468,482 B1* | 6/2013 | Pack | ................... G06F 17/5036 716/110 |
| 2004/0268283 A1* | 12/2004 | Perry | .................. G06F 17/5045 716/119 |

(Continued)

*Primary Examiner* — Binh Tat
(74) *Attorney, Agent, or Firm* — Gates & Cooper LLP

(57) ABSTRACT

A predictive electronic circuit design system, method, and apparatus provide the ability to design an electronic circuit. An electronic computer aided design (CAD) environment server computing device is connected to the Internet and includes a machine learning module program. The machine learning module program has a netlist analyzer program, a database, and a classifier and predictor program. The netlist analyzer program receives a circuit netlist for a designed circuit from a user, characterizes the circuit netlist, and sends characterization data to the database. Characterization data from multiple users for multiple designed circuits are stored in the database. The classifier and predictor program uses design goal data, the characterization data for multiple designed circuits, and simulation results, to calculate and produce predictions and proposals for the user to make design changes to the designed circuit in order to better meet or exceed design goals.

16 Claims, 10 Drawing Sheets

(56) References Cited

U.S. PATENT DOCUMENTS

2010/0058269 A1* 3/2010 Baker ................ G06F 17/505
716/122
2010/0058270 A1* 3/2010 Steinmetz ............ G06F 17/505
716/126

* cited by examiner

PREDICTIVE MULTI-USER CLIENT-SERVER ELECTRONIC CIRCUIT DESIGN SYSTEM UTILIZING MACHINE LEARNING TECHNIQUES

CROSS-REFERENCE TO RELATED APPLICATIONS

This application claims the benefit under 35 U.S.C. Section 119(e) of the following co-pending and commonly-assigned U.S. provisional patent application(s), which is/are incorporated by reference herein:

Provisional Application Ser. No. 62/121,391, filed on Feb. 26, 2015, with inventor(s) Edward Sandor Pataky, entitled "Predictive Multi-User Client-Server Electronic Circuit Design System Utilizing Machine-Learning Techniques."

BACKGROUND OF THE INVENTION

1. Field of the Invention

The present invention relates generally to computer simulation tools, electronics computer-aided design (CAD), machine learning techniques, data mining, and circuit design systems, and in particular, to a method, apparatus, and article of manufacture for quickly and efficiently analyzing a circuit design.

2. Description of the Related Art

It is difficult for anyone to design a circuit that performs the function well, and is optimized for multiple parameters such as cost, size, physical complexity, power, and other target design goal metrics. Existing tools may allow for some local optimization of design parameters, but these tools are cumbersome, have a learning curve/are difficult to understand or use, and are at times ineffective in helping the user reach their design goals.

Therefore, what is needed is a simple and quick way to obtain a rich set of qualitative analysis on a circuit design without needing huge computational resources and time commitments to complete comparative studies and a way for an electronic circuit designer to meet or exceed design goals with shorter design time and with more accurate and robust results, to be able to quickly perform verifications of manually designed circuits across multiple target metrics, and to be able to quickly access comparative results of a circuit using parts across different manufacturers so that the designer is automatically informed of the state of the art without needing to manually research the current state of the art. To better understand the problems of the prior art, a description of various circuit design techniques may be useful.

Designers of electrical circuits, and electronic circuit boards, since the advent of computer-based simulation and design tools, have used mainframe, and personal-computer-based software to perform electrical circuit and system design. In general, considering system architectures, existing design and simulation environments may be placed into one of two categories. Some programs (e.g., the PSPICE™ program), are installable on a user's machine, and can be run entirely within that single machine, with the full capability for design, simulation, and board layout. Such programs may be referred to as "standalone" or "client-only" design environments. Other programs use a client-server architecture, where simulations are run on a server, for example in universities or companies, and multiple clients connect to those servers for running simulations.

In today's world, for the first time, more mobile devices are being sold than standalone desktop or laptop computers. Users are using mobile smartphones, and tablet type devices in record numbers, and cloud-based computing has increased in popularity in such a way that it is no longer the domain of high-tech university laboratory experiments or supercomputer institutes. For example, with various tools (e.g., GOOGLE APPENGINE™, or AMAZON'S AWS™ services), even the most novice developers can have access to computing "clouds" for their own applications, even free of cost in some cases. This is a totally new capability, and totally new system designs are required to keep up with the pace of growth of users' needs for fast, scalable, always-connected applications and devices.

This new capability has given rise to new cloud-based electronic circuit design systems that may offer users the capability to move from a traditional desktop or laptop computer to a mobile device, with the same electronic design capabilities on both systems. Files in such design systems may be saved on back-end servers in a user's own directory, and computationally-intensive circuit simulations were carried out in the cloud. This recent change marked a new era in electronic circuit design, and physical printed circuit board manufacturing soon followed. Not only did circuit design and simulation move from a client-only system to a client-server system, but it also became social, where thousands of users could potentially have the ability to contribute and benefit from shared resources within the circuit design toolset. In these short few years the landscape of electronic design has changed dramatically.

However, to date, none of the systems have taken advantage of the vast amount of data that could be harnessed by the existence of such a system.

SUMMARY OF THE INVENTION

Embodiments of the invention provide a system that uses machine learning and datamining techniques, applied to the field of electronic circuit design and related CAD tools, in order to provide a system that can dramatically reduce design time for new designs. The basic concept is easily understandable and the resulting system is novel and groundbreaking with the potential to forever change how circuit design is learned, practiced, and taught, yet not one single system exists today utilizing the techniques described herein.

Some embodiments of the invention include a novel predictive electronic circuit design system utilizing machine learning techniques. In some embodiments, the predictive electronic circuit design system comprises a predictive electronic computer-aided design (CAD) circuit design system and a set of machine learning methods. In some embodiments, the predictive electronic circuit design system utilizes the machine learning methods in order to learn and provide proposals to a user of the predictive electronic circuit design system at design time, thereby allowing the user to be able to more quickly design an effective circuit that meets design goals, with optimized parameters. In some embodiments, the machine learning methods find statistical relationships between possible schematic design changes that meet or exceed the user-specified design goals, thereby providing predictions of changes that may improve schematic and/or circuit designs to meet or exceed the user-specified design goals. Some embodiments provide a method for obtaining qualitative analysis of a circuit design without needing huge computational resources and time commitments to complete comparative studies. Some embodiments verify a manually designed circuit across multiple target metrics by accessing comparative results of the circuit using parts across different manufacturers.

In some embodiments, the machine learning methods are part of a machine learning module. In some embodiments, the machine learning module comprises a set of schematic inputs and a set of user design goals. In some embodiments, the set of user design goals are combined with at least one of a set of universal design goals, a circuit netlist, a set of simulated output, and stored data from past executions of the machine learning module.

In some embodiments, at least one of the machine learning methods comprises a method for providing predictions and proposals to find statistical relationships between the set of schematic inputs and the stored data from past executions of the machine learning module. In some embodiments, at least one of the machine learning methods comprises another method for automatically and dynamically defining circuit classifications by a combination of the design goals and circuit netlist information, extracted netlist information, circuit topology information, and a set of other characteristic information extracted from the inputs. In some embodiments, the other characteristic information includes one or more of robust, high gain, and high performance transistor based voltage amplifier. In some embodiments, the machine learning methods learn how to classify new circuits within each class as classified. In some embodiments, the machine learning methods learn how to design a circuit that will be classified into one or more such classes, such that given a new set of inputs and a new circuit, the machine learning module can provide a prediction based on the learned class and characteristics of the class.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Basic Circuit Design System

Figure 1:
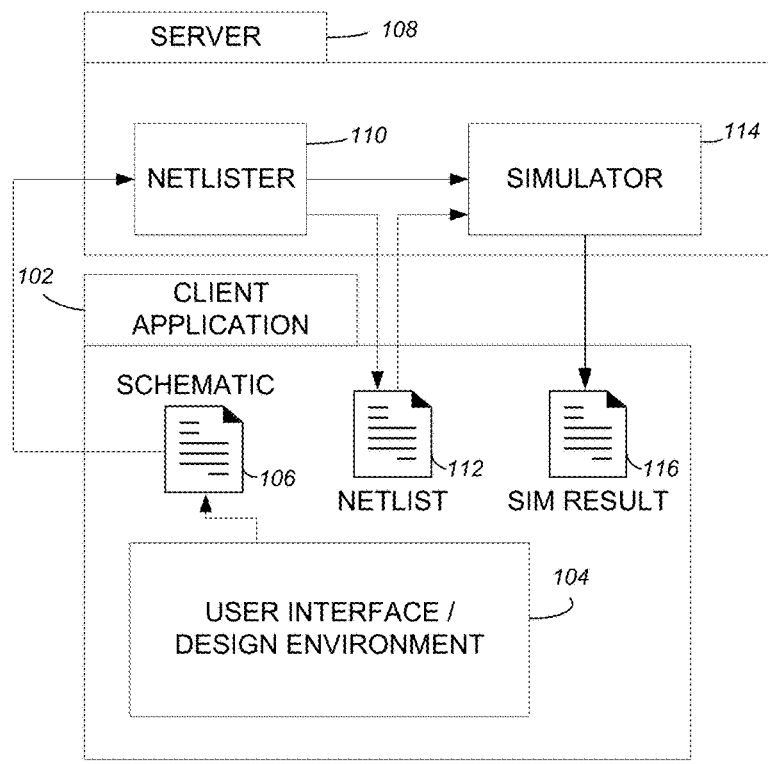
FIG. 1 illustrates a basic server-client circuit electronic computer-aided design (CAD) system of the prior art.

FIG. 1 illustrates a basic server-client circuit electronic computer-aided design (CAD) system. In this example, the client application 102 provides the user with a user interface 104 that is used to produce a schematic 106 of a circuit. The client 102 sends the schematic 106 to the server 108 for processing (in a netlister/netlisting application 110) which produces a netlist 112 (text representation of a schematic 106). The netlist 112 is sent to a simulation program 114 (also referred to as a simulator) (along with additional simulation parameters), on the server 108, which results in simulation results 116 being sent back to the client application 102 and presented to the user. Note that this example does not make any assumptions about the number of servers 108, and in fact there may be many servers 108 involved in logging in the user, performing netlisting, performing simulation, and other operations. For the purposes here, the server 108 or cloud server system is represented and termed as a single server and similarly for the client 102, which may or may not be running multiple programs or modules to carry out its tasks. In addition, the netlisting portion 110 can easily be carried out on the client 102, then sent to the simulation program 114 on the server 108, and no specific assumption is required that the netlisting 110 be carried out on the server 108.

The general system in FIG. 1 is representative of the modern, server-client type electronic circuit design system that has arisen in popularity in recent years. Note that if one removes the server 108 and includes all operations on the client 102, the resulting system would be representative of a traditional client-only electronic cad system.

Figure 2:
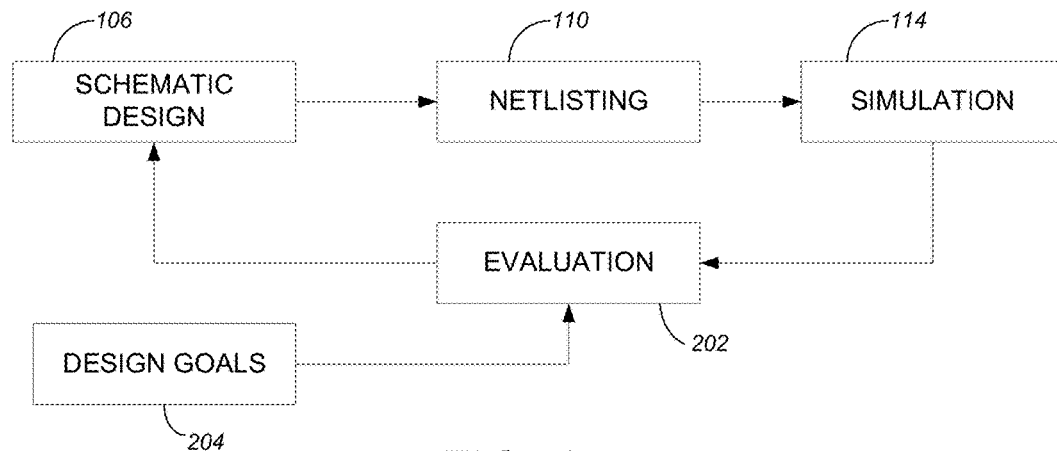
FIG. 2 illustrates the traditional design iteration flow of the prior art.

FIG. 2 illustrates the traditional design iteration flow of the prior art. Note that the evaluation block here does not represent a software module, rather, it represents the steps that the user takes to evaluate the simulation output 116 before going back to the schematic 106 for another iteration of the design procedure. The depiction in FIG. 2 in fact represents the general design flow for any computer based electronic CAD circuit design system. In this design flow, the schematic 106 is modified until the netlisting 110 and simulation 114 results produce outputs 112/116 that, when evaluated 202 by the user, achieve the design goals 204. Note that the design goals 204 the user has are critical for the evaluation 202. It is noted that the design goals 204 are typically informal, and may not even be entered to the client application 102 in existing systems. This is repeated as changes are introduced into the schematic 106 (or optionally directly into the netlist 112) and the simulation 114 and evaluation 202 are repeated.

As illustrated in FIGS. 1 and 2, none of the existing systems use machine learning to provide predictions or design change proposals based on large existing datasets from a multi-user client-server system (e.g., cloud type system).

To better understand the problems of the prior art, further description of traditional systems may be useful. Various applications have been developed and assist in the simulation and design of electrical circuits. The SPICE™ application is one such application design by the University of California at Berkeley. Since the introduction of SPICE™ and other circuit simulators, many traditional circuit CAD systems have been developed. One such program was PSPICE™, a program created by the MICROSIM company in 1984. It was later bought by the ORCAD company, renamed and improved, and is still used today. Another application is LTSPICE, produced by the LINEAR TECHNOLOGY company. Both of these programs are traditional, single client-based installable software executables that can run without any connection to any servers or cloud services.

In traditional circuit CAD systems, the user has to obtain and install the software executable, as well as any libraries or part models they wish to use, and these are only useful on that one machine they were installed on. In addition, work does not primarily reside on any remote servers, and there is even no method of social sharing or social feature integration. Typically, traditional circuit CAD is something that is used when one sits down in an office, or in a school lab. The concepts of mobility and social sharing are not present in traditional systems.

Another type of system that gained popularity that is somewhat different than those described above, but may still considered traditional, are those that cater well to distributed needs, such as in a university or workplace setting. The HSPICE application is one such product that is typically used in the form of a local server-client system that is available only to a relatively small number of users within the institution that the license is valid. In this case, similar to the above-described applications, there is no sense of social sharing, and local machine installations still need to be performed, for example on all personal computers (PCs) in a lab room, although the servers can be remote. HSPICE has an option for running as a client-server architecture but very different from the modern systems described herein. The difference is in terms of numbers.

Even in the largest of universities or companies, at most there could be possibly 50,000 users accessing the system, but this is a very liberal figure, and most installations of the HSPICE application are probably used at most in the hundreds of users at any given institution where it is deployed. Licenses are very expensive, and only the largest of institutions can afford the license, and maintenance and IT support costs.

It is noted in these traditional systems, even in the case of some distributed systems, that the storage, netlisting, and simulation of circuits is all done locally (or equivalently, on local servers) on the machine the user is using at the time, and only the license server is remote. For this reason, and due to the number of users being typically from 1 to at maximum in the hundreds, there is no way traditional systems could even consider trying to add a Machine Learning module for the purpose of learning and proposing circuit changes to meet design goals. It simply would not work due to not having enough information to be useful.

Even in a large company of thousands of employees, most likely there would be at most 500 people who would even know how to use a circuit simulator, and even if those 500 people submitted 50 circuits per day, after 1 year of use that would only amount to 9 million circuits. If on the other hand, a modern client-server system is used, and 100,000 users submit just 1 circuit per day, that makes over 36 million circuits, and this is a conservative estimate, for, systems already exist (such as AUTODESK™ 123D CIRCUITS™) with hundreds of thousands of users and it continues to grow every day. Embodiments of the present invention will take advantage of the growing trend that literally millions of users will soon be using client-server circuit CAD systems every day, for work, for school, and the information is just waiting to be utilized. Prior art systems fail to take advantage of such a growing trend and further, fail to even recognize the significance of such a trend.

Modern Client-Server/Cloud Systems

The modern client-server or client-cloud system has thousands of clients daily accessing the software through the web, or through any number of easy to install applications native to any number of mobile devices, tablets, and phones. This type of system is sometimes offered to the user for free or via a low-cost subscription and is termed Software as a Service (SaaS). One such system is the line of so-called SPICY products from the ISCHEMATICS LLC company in California, USA (see www.ischematics.com). With SPICY, a user can login and retrieve their files on any computer that has a web browser, and no special installation is needed. User files are stored on ISCHEMATICS' servers, and simulations are carried out on the servers as well. In this sense, the client application is simply a user interface (UI) and a viewer of the simulation results. Note that the user can also access this type of software from mobile platforms such as the APPLE IPAD or ANDROID-based tablets. Since the application is web-based, virtually any device with a proper web browser can access it, as long as the software author allows it.

This type of system allows the user to start a design in one location on a traditional computer, such as work or school, and complete it in another location, such as on the train or in a coffee shop, using their mobile device. Since there is no special software to install, the user can login at a computer anywhere such as a library, for example, and continue their work. As long as there is an Internet connection, the client-server/cloud-based system functions and offers the user more flexibility than ever before. Some features are typically not available when the user is offline, and this is the main drawback, but nowadays most people are online on a regular basis and are familiar with server-based software (such as GOOGLE DRIVE, MICROSOFT OFFICE 365) and how it works. Government entities, private companies, and institutions are even planning on how access can be given for free internet access to everyone who needs it.

It is noted further that the client-server system also has the advantage of lowering the cost of hardware for the user. With this type of system, all the computationally intensive tasks are carried out by the server, so the client device hosting the client application or portal (web browser), needs only to be able to display results and perform less intensive tasks such as the UI operations and data plotting, etc. This is a huge benefit to the user, who can for example, purchase a low cost mobile tablet device, but get the same simulation capability as someone with a $10,000 desktop PC.

It is important to note that the modern, client-server/cloud based systems that were introduced first around 2011 with the release of SPICY from ISCHEMATICS LLC, were offered either for free, or at costs orders of magnitudes lower than traditional software. Such offers were based the nature of the client-server/cloud system being a (no-install) web-based application, or an easily installable tablet app-based application. Based on the low cost, this type of system attracted many users.

Having 100,000 users for a client-only application is no different than having just 1, except for in terms of revenue, unless the system regularly gathers information from the usage statistics of those users and their circuits, and has some method of using it to give information back to those users. It is simply impossible to make use of that information in a client-only software application that does not require the Internet to operate.

In the modern client-server system and as described with respect to embodiments of the present invention, the use of such information is very possible, with some architecture and operational changes as described herein. The server-client system, since it already uses remote servers to do computationally intensive tasks, and already has access to server/cloud-hosted databases and data-stores, can be modified to include a Machine Learning Module and a feedback path back to the client application, in order to be able to provide predictions and proposals to the user to help them meet their design goals. In fact, it is only because of the advent of cloud computing, and the modern client-server circuit CAD systems, that embodiments of the invention described herein would be possible and/or useful. To be able to store all the information required for a useful system will require incredibly large data storage, and to be able to process predictions and other operations will most likely require very powerful modern cloud-based computational systems.

The above being said, the benefits will outweigh the overhead in system infrastructure or even its cost, as users will now be able to benefit from thousands of users who may have already simulated very similar circuits thousands of times before them. This type of knowledge transfer, and the growing scale that will be possible, embodiments of the invention provide the starting point for a completely new era in circuit CAD and circuit design in general. On any given particular design task, there is simply no other method to be able to learn from thousands of people across time and space (distance) at an instant, simply by asking a tool to give an informed proposal or prediction. This type of system does not exist today, and once it does, it will change the world. Students will learn faster, and workers will produce well-performing and optimized designs faster, leading to better engineers, faster product development, and more productivity.

Design Systems with Goal Optimization

It is noted that although machine learning systems on the scale described herein for circuit CAD have never existed, that it is not the case that intelligent tools have not existed that help users optimize designs to meet design goals. Tools for designing Field Programmable Gate Arrays (FPGAs) and other similar products exist in the prior art and provide optimization tools. The difference is that, like in the traditional circuit CAD system, the simulation and optimization is done locally, and based only on the user's design and some very limited number of options programmed into the software, and there is no use of user history taken from a large group of users, nor is there any concept of a live database of component parts input to the system.

It is noted here that, it is not only the number of circuits that makes the Machine Learning based circuit CAD system intelligent, it is also the number of users, for there is always some bias (educational, professional, cultural) present in any given user, but across users, the possibilities are much greater for optimized designs. In other words, if a user never understood bipolar transistor circuits during the user's education, for example, the user would most likely not design circuits using them, even though there may be no better option for a given design task and set of goals. If the optimization or prediction system is using a large amount of data, but from only one person, it is inherently flawed. Only by using lots of data from lots of users can a system such an ML-based circuit CAD system truly learn.

Machine Learning Systems

Machine Learning itself is not a new sub-field of computer science, but has grown in popularity in recent years due to availability of large amounts of data storage, and large computational capacity. One definition is that Machine Learning is the study of algorithms that can learn from data by building a model based on inputs, and using the model to make predictions or decisions.

There are now hundreds, if not thousands, of example applications where machine learning is used and is useful, from bioinformatics, image processing, signal processing, game design, robotics, and more. A simple and widely known example, which is also a billion dollar industry, is the gaming industry, including products from companies like MICROSOFT, NINTENDO, and SONY. There exists however, no such system that uses the machine learning techniques described herein towards a client-server based predictive circuit design system.

Electronic Circuit Design System with Machine Learning Module

Figure 3:
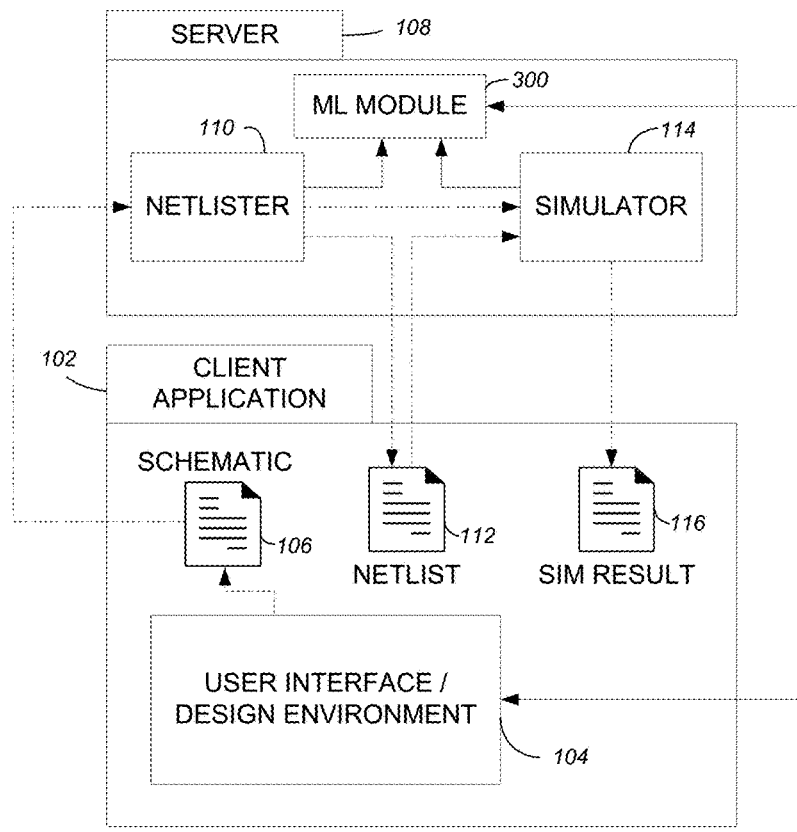
FIG. 3 illustrates an electronic circuit design system with a machine learning module in accordance with one or more embodiments of the invention.

FIG. 3 illustrates an electronic circuit design system with a machine learning module in accordance with one or more embodiments of the invention.

The original connections (similar to the prior art of FIG. 1) are shown in dashed lines, and the new connections are shown in regular solid lines. There is a new component added to the system, namely, the Machine Learning and Data Mining module 300, herein called the ML module 300. Note that the netlister 110 and the simulator 114 provide their outputs to the ML module 300, and the ML module 300 and the user interface/design environment 104 have a bidirectional connection as well.

The Machine Learning module 300 represents the hardware and software required to make classifications of past circuit designs, and to make predictions (or proposals) for future designs based on design goals. It is noted in fact that the ML Module 300 need not be on the server 108, although it would make the most sense for this to be the case, it is not specifically required for embodiments of the invention.

The addition of three concepts (goals, classification, and predictions), combined with either a traditional client-only or a more modern client-server or client-cloud system, provide some of the novel and useful aspects of the predictive electronic CAD system in accordance with one or more embodiments of the invention.

The ML module 300 not only allows the user to create a circuit that achieves the design goals 204, but to achieve them while providing optimization for the circuit complexity and size/area, circuit cost, circuit performance, and power consumption, in terms of the real physical circuit the schematic 106 models. Embodiments of the invention can learn, particularly in the case of a client-server system that serves many thousands of users, which circuit designs meet which design goals and why. On a finer scale, predicting what specific component changes or what circuit topology changes a user can make at any given time, and presenting those to the user will prove to be a novel and powerful design input.

A simple example to illustrate the point is the following: Suppose a user is building a circuit with one voltage input and one voltage output, and has specified that their design goal 204 is to have the output be equal to 10 times the inputs (they are designing a voltage amplifier that requires a gain of 10), and suppose they have already placed an operational amplifier (op-amp) component in the circuit. Given this information, and combined with information from say 10,000 already simulated voltage amplifier circuits with the same inputs, outputs, design goals 204 and that use op-amps as the active elements, a machine learning and data mining module 300 can propose to the user in real time as they are building the circuit, one or more circuit topology options that will meet the design goals 204, while also optimizing one or more standard (global) design goals 204 like area, power, cost, noise, or other.

In other words, there are many ways to design an amplifier with a gain of 10. If you are using op-amps, that list is shortened, and if you want to optimize for say cost and size, as is done in modern wearable product designs, that list is even shorter. Given a large dataset (a database of thousands of analyzed circuits), a machine learning and data mining system 300, can predict and propose to the user what the best option is to reach their specific design goals while also meeting overall design goals. For the user, a design that might have taken the user all day or all week to design, now could potentially take minutes with instantly available feedback from the ML Module. Unless the user requires a deep knowledge of the inner workings of the circuit (which is not the case in many practical working environments), the predicted and proposed circuit will do just fine. In the case of academic work, the predictor can be used to validate manually designed circuits. In fact, there may initially be a fear that type of system will take away from traditional circuit design methods but in fact as will become clear, this type of system relies on and works best when there are users feeding the system with highly optimized, well designed circuits. For the system to learn how to design optimized circuits, and unless it has corresponding examples to learn from, the system cannot perform to its best ability. On the other hand, the system can do things that humans cannot, as described herein.

In the case of manufactured parts like integrated circuits (IC), new products are becoming available every day, and no one person can keep up with the changes so quickly without doing time-intensive market surveys and other investigations regularly.

Embodiments of the invention allow users to easily take an existing design and quickly validate whether it still meets the design goals optimally given what is available on the market at any given time. This is possible because the data stored and learned by the system is always looking for the best solution to the specified design goals 204 given a set of inputs and outputs, and given other meta properties like the circuit topology or other descriptors and classifiers including what part models are used. Only by the use of such a large dataset, that can be obtained easily given a modern client-server/cloud CAD system, can this type of prediction and proposal be achieved.

It is noted here for clarity that embodiments of the invention do not require the use of a client-server/cloud system, although it should be clear from the explanation and examples above that a client-only system would suffer severely from having a small dataset, and therefore the predictions possible would be limited to only what the individual user has created in the past. It is not ruled out to implement the ML module 300 with a client-only system, but the system becomes orders of magnitude more useful and appropriate when considering a modern client-server/cloud based cad system.

Figure 4:
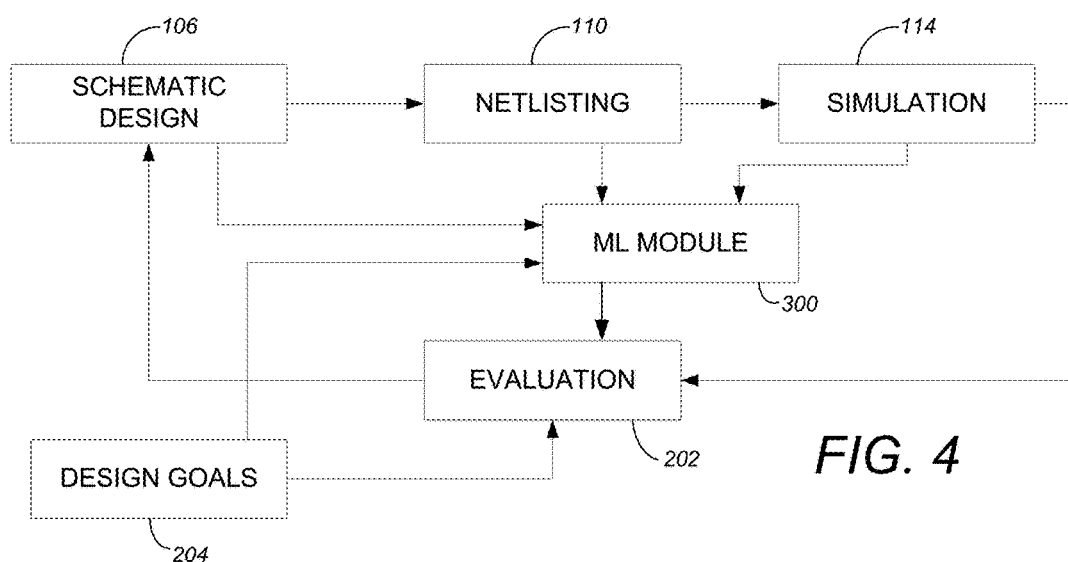
FIG. 4 illustrates the design iteration flow based on the electronic circuit design system with a machine learning module illustrated in FIG. 3 in accordance with one or more embodiments of the invention.

FIG. 4 illustrates the design iteration flow based on the electronic circuit design system with a machine learning module illustrated in FIG. 3 in accordance with one or more embodiments of the invention. In the new design flow of FIG. 4, note that the ML module 300 takes the schematic 106, netlist 110, design goals 204, and simulation outputs as inputs 114, and produces input that is fed into the evaluation step 202 before repeating the iteration. Note that the design goals 204 are critical not only for the evaluation by the user, but also for the ML Module 300. Without knowing what the user wants to accomplish (design goals 204), there is no way for the system to learn and propose what would work best. On the other hand, it is noted that even if the user does not specify specific any particular design goals 204, there are some implicit, general and universal design goals that all designers want to achieve, such as minimum part count, minimum area, minimum cost, and minimum current draw and/or power. Thus, even in the absence of user-specified goals, these sort of universal goals can be used by default.

It is further noted that, how the system presents the ML Module 300 outputs can be varied, and is not restricted to any particular form in embodiments of the invention, although some specific embodiments will be presented here to better illustrate the point. For example, given a set of conditions (schematic 106, input/output, design goals 204), it may be that the ML Module 300 output simply consists of a proposal of a single different component than in the original schematic 106, or, it could be an entirely new topology. This could be presented to the user visually as pre-rendered schematic or pre-made image, or simply in text as a popup suggestion with text description. Embodiments of the invention do not prescribe how the predictions should be presented, as they are equivalent from the point of the view of this invention, rather, embodiments of the invention provide a new design flow utilizing the ML module 300, and how the ML Module 300 internals work.

From the user's point of view, the user will be able to setup a basic schematic 106, with inputs, outputs, design goals 204, and some rough draft of a circuit, and will be able to iterate his/her design, with proposed changes coming (more or less in real-time) from knowledge gained from thousands of simulations by thousands of users. Users will be able to meet their design goals faster, with the satisfaction that they have designed a good circuit, that is stable, robust, and has been checked across many different domains and across different variable ranges, tolerances, and with noise other non-idealities in mind.

In fact, there is no practical reason why student after student, worker after worker, should be simulating the noise characteristics or frequency domain response of a well-known, well analyzed circuit, when it has been done hundreds of times before. In the future, these types of repeated simulations will be a thing of the past, and instead, instantly and in real-time, anyone can have access to simulations, aggregate data, characteristic descriptions and specifications, and other information already run for their particular circuit and given their particular design goals.

Consider a simple RC (resistor-capacitor) circuit, or RLC (resistor-inductor-capacitor) circuit that likely every electrical engineering student will simulate in a circuit simulator (e.g., the SPICE™ simulator). Across the world, in fact, the same circuit topology will be simulated, likely literally thousands of time each day. If circuit CAD systems had machine learning modules integrated, there would be no reason for this, and in fact as the number and variety of circuits simulated increases with the proposed system, the less likely any given new circuit will require a new simulation. Rather, completed raw simulation data and other characteristic, aggregate and otherwise useful extracted information readily available in the server databases can be presented to the user even prior to them requesting any simulations.

Only when new components, or new models, or new topologies are developed will small perturbations be introduced into the ecosystem of simulated circuits and respective results, but as time goes on each new schematic will become less and less novel. In other words, an electronic circuit CAD system that utilizes a machine learning module 300 in order to make design predictions based on goals 204, combined with a client-server system serving many thousands of users, will be able to hold the world's knowledge of circuits and provide real-time access to that knowledge on a scale never before seen in history.

System Components

From FIGS. 3 and 4, one can consider a modern client-server (or equivalently client-cloud) circuit design CAD system (FIG. 3) and design flow (FIG. 4). The operation and purpose of this system is as follows: (1) Using the provided user interface (UI) and design environment 104, the user creates a pictorial/visual representation of a real physical electronic circuit, called a schematic 106; (2) The schematic 106 is sent to a netlisting program 110 that converts the visual schematic information to a text-based representation of the circuit, called a circuit netlist 112; (3) The netlist 112 is then fed into a circuit or network simulator program 114 that produces simulation output 116; (4) the output 116 is fed back to the UI 104, optionally for plotting, or other processing; and finally (5) The user may optionally use the resulting netlist 112 and simulation output 116 to modify their schematic design 106 and to repeat the process as part of a design iteration loop.

Implicit in the description of the client-server/cloud system (and equivalently in a client-only system) in the preceding paragraph is that for any useful work to be done by the user (namely, to design a useful circuit), there is some Design Goal 204 in mind at the time of schematic creation. This is to say that, the user wishes to create a circuit, or system, that takes some inputs, and produces some output that meets some pre-determined criteria. In the case of electronic circuits, this can be in the form of a value of current, a specific voltage, a so-called circuit gain, or other criteria that can be exhibited by an electronic circuit, or more importantly for a computer-based circuit design system, by the electronic circuit simulation program output.

Figure 5:
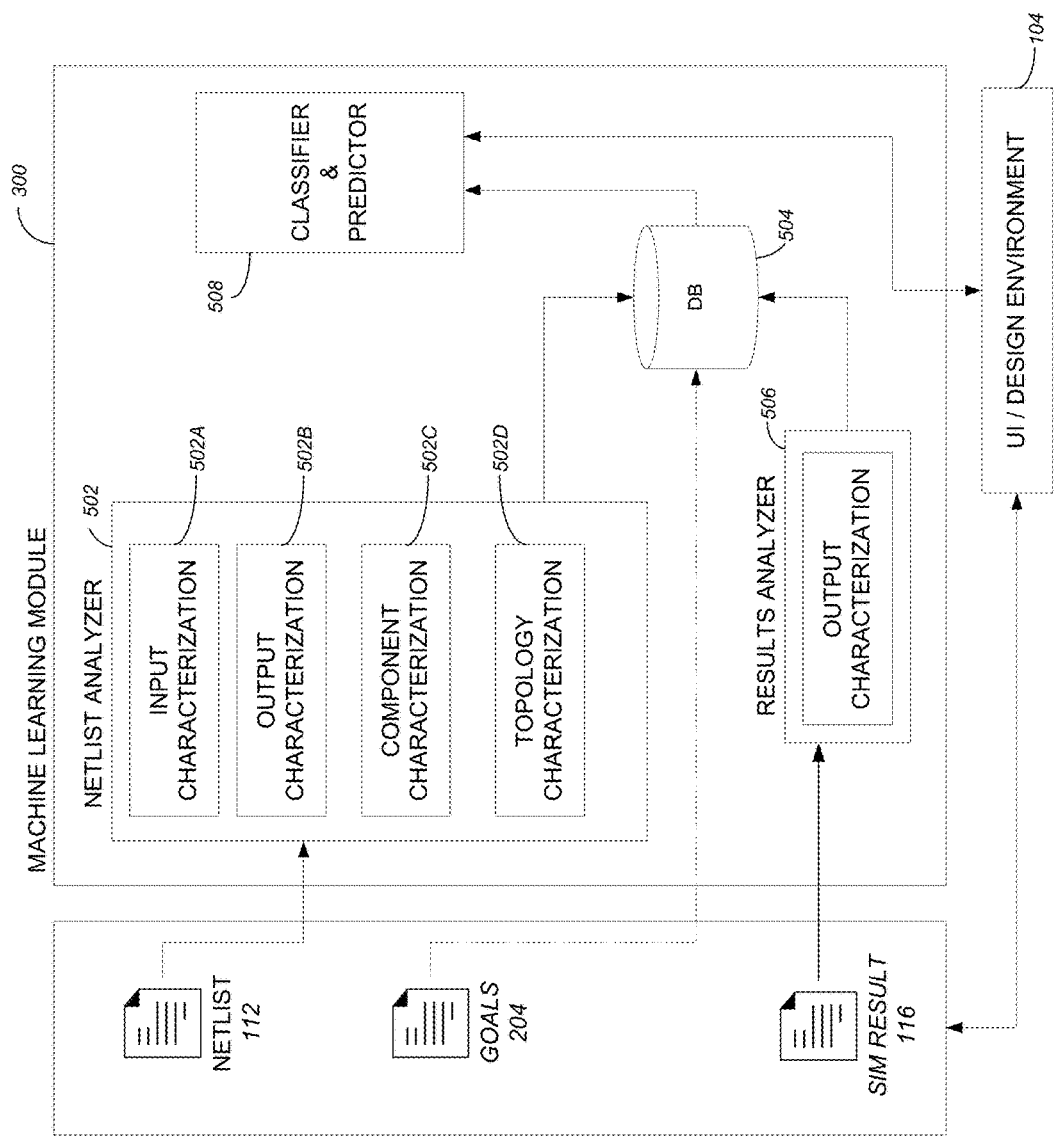
FIG. 5 illustrates further details of the components of the ML module in accordance with one or more embodiments of the invention.

FIG. 5 illustrates further details of the components of the ML module 300 in accordance with one or more embodiments of the invention. In this representation, the separation of the client and server/cloud is not shown and is not necessary, since FIG. 5 intends to show operations from the perspective of the new ML module 300 and the UI 104. The netlist 112, design goals 204, simulation results 116, and UI/Design Environment 104 represent the UI system 104 and its outputs (including design goals 204 that the user would specify), and some of the outputs from the server software (netlist 112 and simulation results 116). Inside the ML module 300 is a netlist analyzer 502, a database 504, a results analyzer 506, and a Classifier and Predictor module 508. Note that the same inputs to the ML module 300 from FIG. 3 are also present in FIG. 5, namely, the netlist 112, goals 204, and simulation output 116 being the ML module 300 inputs, and a bidirectional connection between the ML module 300 and the UI system 104 (in FIG. 3, the goals are assumed to be included in the bidirectional connection between the ML module 300 and the UI system 104).

It is noted that the database 504 need not be any particular type such as relational or otherwise, rather, it refers simply to any mechanism for storing data, such as simple data files. It could certainly be a traditional database, or a new modern type of data-store or other cloud-based storage system, but no inference is made on the type of database, only that it is a subsystem that allows for the storage and retrieval of data needed by the system. In addition, the inclusion of the database 504 in the ML module 300 illustrates the logical connection, and it should be noted that the ML module 300 does not necessarily contain the database 504 as might be inferred by the figure, rather, the ML module 300 contains a reference to the database 504 (wherever it resides and whether it is a submodule of the ML module 300 or an external program). This is in contrast to the ML module 300 submodules 502, 506, and 508 which are truly part of the ML module program source code.

Operation Phases

The ML module 300 works in two main phases: (1) the Learning Phase; and (2) the Prediction Phase.

The Learning Phase runs when there is a netlist 112, simulation results 116, and optionally design goals 204, available as input to the ML module 300. This could be after each time a circuit is simulated, for example, but need not be each time, rather, it could be performed only when a user closes their design and has run at least one simulation result 116, for example, or it could be only once a design has met its design goals. The Learning Phase starts when these inputs 112/204 are presented, and ends with data being stored in the database 504 for later use by the Prediction Phase.

The Prediction Phase runs as a user is designing their circuit, potentially (but not necessarily) before they have ever even run a single simulation on their schematic. In this phase, the information learned from past circuits and past circuit simulations on those circuits (potentially thousands or even millions of each from many users) is used to predict and propose to the user, one or more possibly useful schematic changes given the user's design goals 204. At the extreme, the Prediction Phase could even propose an entire circuit based only on inputs, outputs, and design goals 204, although much simpler predictions can be equally as useful depending on the user and their design needs. As noted above, in what form this proposal is presented to the user needs no prescription, as it can take many forms. The fact that it is possible and available is one aspect of embodiments of the invention.

It is noted that in the prediction phase, although it is not required to run simulations, it is expected that the user has obtained or provided a netlist 112 and has chosen some design goals 204.

Learning Phase

In the Learning Phase, the Netlist Analyzer 502 first analyzes the circuit netlist 112. This includes 4 steps: (1) characterize and classify the inputs of the circuit 502A; (2) characterize and classify the outputs of the circuit 502B; (3) characterize and classify the components used in the circuit 502C; and (4) characterize and classify the circuit topology 502D.

It is noted here that in fact more information than just the standard netlist 112 may be required at this step, in fact, schematic information may be required as well. The distinction is clear when considering that in a given schematic, a signal may be designated as an input (for example by the use of an input port symbol or by the name including special identifiers such as the word 'INPUT' for example), but in a netlist 112 there may not be any such designation. In fact, the same netlist 112 could be used for two very different schematic representations, simply by assigning inputs and outputs differently in the schematic. This goes similarly for outputs and other netlist information. For this reason, and as used herein, a netlist 112 may be assumed to include some additional schematic information that is included in the netlist information, either at the time of netlist creation or in a subsequent post-processing step where schematic information is mapped into the netlist. A simple example and embodiment of this extra information would be that the netlister 110 appends a comment after each component or feature definition in the netlist 112 that includes this extra information. In this way, since the information is present in a comment, it does not affect the netlist 112 in simulation, and because it is present in the netlist 112, the schematic information itself need not be input directly into the ML Module 300 (the enhanced netlist 112 is sufficient).

Characterization and classification of the inputs 502A can be as detailed or as simplistic as required by the application. At the extreme, there would be literally hundreds of classifications that inputs could be assigned to. One or more embodiments would involve checking each input source to determine its type (such as voltage source or current source), which domain the source is functional in (time domain, frequency domain, other), if there is a controlling function what that function is (sinusoidal, step function, other mathematical function and the specifics of the function parameters), the magnitude of the source (for example a value in Volts or Amps), and any bias or offset value the source has. Other classifications may include whether the signal is analog or digital, or mixed signal, whether any noise or value/parameter variation is specified, and whether the source is ideal or includes non-ideal specifications (such as a voltage source that has an output resistance).

Note that depending on the circuit, and the simulator 114 used in the system, it is possible to define that the input for a circuit is not a voltage or current source, but a passive element or power input, or other electrical value. Embodiments of the invention do not prescribe any specific type of simulator 114 or its corresponding input or output sources, and it is noted that different simulators 114 use different components, different signal types, and different simulation methods.

Characterization of outputs 502B from the point of view of the netlist analyzer 502 refers to the properties of the labeled or specified outputs from the schematic 106. Note that at the time of netlisting 110, the simulation results 116 are not yet known, so output signal characterization cannot yet be done, rather, the outputs can be classified from the point of view of the schematic 106. This means, for example, that if the user specifies they want to monitor a voltage as an output of their circuit, then that output is classified simply as a voltage output. Similarly for other types of outputs.

Regarding component classification 502C, depending on the simulator 114 and UI system 104 used, the netlist analyzer 502 (e.g., a component analyzer within the netlist analyzer 502) can classify circuit components based on many parameters such as their specific type, whether they are passive or active, whether considered analog or digital, whether they are modeled after discrete or IC (integrated circuit) type parts, related to cost—whether they model a part from a particular manufacturer, their physical size if they model a real physical part, their known component power or current or voltage requirements, and many other parameters. Circuit components come in many types and sizes, and as many characteristics that can be included the better.

It is noted that there may also be many application-defined meta-characteristics. For example, based on model parameters, transistors may be further classified as "high gain" parts, or based on material values, some passive components may be classified as "low thermal noise" parts. These classifications can be beyond what the manufacturer might provide, or even what a part model might specify; typically this type of information would either be common knowledge, or would have come from previous simulations, or other sources. Regardless of where the information originates, there may be a wealth of extra information that can be extracted from more easily obtained information, and this meta-information, about the inputs, outputs, or similarly components or circuit topology may prove to be even more useful than the more easily obtained information. What types of meta information are extracted from the circuit is defined by the application, and embodiments of the invention do not prescribe or require any specific set.

Finally, similar to components, the circuit topology is analyzed and characterized, and classified 502D. It is noted that there may be multiple levels of classification for a given circuit. For example, a top level classification of a circuit may be that it is an "amplifier" circuit. By inspecting the components used, it may further be classified as being a "bipolar transistor amplifier" circuit. Again upon further inspection is may be classified as being a circuit that uses "negative feedback" in one portion of it. The list can continue to infinity in terms of the types of classifications that can be made on a given circuit, and the application that uses this type of system will have to decide which are important. As noted previously, no specific set of classifications is assumed, only that at a high level, there may be classifications made on the topology of the circuit or its sub-circuits. These topology classifications/characterizations 502D are what are typically included in high level circuit descriptions for a particular circuit, and will likely prove to be critical information for the ML methods and the resulting predictions.

At the end of this phase, all information desired by the application is obtained, and that information is stored for later use. It is specifically noted here that, all information need not come from static sources, and in fact the ML module 300, at this step in the process, may choose to run additional simulations beyond what the user prescribed, and even unknown to the user. An example of this would be that if a user simulates a circuit and achieves their design goals 204, the ML module 300 may want to analyze how well the successful circuit does when component variation is introduced or when a different frequency range is simulated. Circuit simulators typically include this type of component variation capability natively and the ML module 300 may choose to run related (or other) types of simulations in order to extract more information than either the netlist 112 or the design goals 204 or the (user) simulation output 116 provides. It is noted that it is possible that an application will find it useful to make use of the ML module 300 as a pre-processing step before storing data into the database 504. For example, it might be useful to run a classification of the user's circuit using the Classifier & Predictor module 508 in order to determine a high-level category for the circuit, and thereby making specific decisions on how to store the data.

Prediction Phase

The prediction phase is utilized when the user is in fact specifically not running any simulation, but is utilizing the UI 104 to design a schematic 106. Once the user has entered his/her design goals 204 (or alternatively, universal design goals can be used), the ML Module 300 can make use of stored data to provide a prediction, or proposal to the user. In fact, depending on the circuit and the design goals 204, there may be many proposals made to the user over the course of their design iterations and workflow. It is up to the application 300 to decide when and how these proposals are generated and presented and no particular method is prescribed here.

To utilize the stored information, the ML Module 300 uses the Classifier and Predictor 508. Classifier and Predictor Module 508 is a sub-module that has access to the stored data (in database 504), as well as data from the current schematic 106, such as the netlist analyzer 602 outputs and the design goals 204. If the user has run simulations already, that simulation data 116 can also be used to determine the predictions, since it would then be in the stored data 504.

To actually make the prediction, what is needed is a machine learning methodology that converts the inputs, to the desired outputs (which may require design changes to better meet the design goals). This methodology can take many forms, depending on the needs of the application.

For example, so-called "reinforcement learning" can be used to create policies that might determine that for a given design goal C, transistors of type A are better than type B. The reason behind such a policy could be based on the modernity of the technology used to make transitory types A and B (or could be based on another rationale). The ML methodology will learn from the analyzed circuits and simulation outputs 116 and design goals 204, that this is the case, and the policy will be used to make simple predictions to inform the user that a choice of transistor type A may be better than B.

Another methodology type that could be used is where statistical information can be used to make inferences based on the historical data. If out of 1 million circuits with certain sets of input, outputs, and design goals, for example, and that those that use components from manufacturer A never meet their design goals, but components from manufacturer B always do, then the probability is higher to meet the design goals if the user switches from manufacturer A to B. Such a conclusion is an inference based on statistics that the system can make and propose to the user as a design change.

Perhaps one of the more applicable methodology types that will be used in a system of this type is a so-called Artificial Neural Network (ANN). An ANN type methodology is particularly good at approximating relationships between variables where there is a large number of inputs, and the relationships between them are nonlinear. This is certainly the case for a circuit CAD system, which will have a large number of input parameters and a large number of output possibilities, and the relationships between them can be highly non-linear, particularly when nonlinear components are used.

It must be noted now, when considering methodologies with inputs and outputs and a particular design goal identifying a relationship between them, that the problem to be solved is in some sense a reverse-engineering problem. In other words, given a schematic that has properties {A}, one wishes to find out what properties {B} result, in achieving simulation output closer to meeting or better exceeding the design goals {G}. The properties may be in the form of circuit topology, component values, component properties, or any other quantifiable value that can be either extracted from schematics, or added to schematics.

Note that going from {A} to {B} requires a schematic change, so the methodology is in fact providing information to indirectly propose a (partially or entirely) new schematic with properties {B} that meets or exceeds {G}. How similar or dissimilar {B} is to {A} will depend on the methodologies used, and how the application calculates and presents the predictions that come from the ML Module 300.

Certainly if a user spends a week designing a schematic with 100 components, only to be proposed that a 10-component schematic is much better, the user may be unhappy with that proposal as the user has lost a lot of time, but this sort of decision on what level of a proposal to make is an application-level decision mostly. It also depends on how much capability and how much data the methodology has to work with. Ideally, given some proposals from the ML Module 300 and the methodologies it has run, proposals would be presented to the user that can be easily chosen by the user, which would then be applied to the schematic 106, and the user could choose to verify this choice by re-simulating the circuit and verifying the proposal provided better results than the original circuit.

It is noted that these aforementioned concerns are not in the domain of this invention and no specific related logic is prescribed here along those lines. For the purposes of embodiments of the invention, it suffices to say that the ML Module 300 will use some machine learning method(s) to find a relationship between the inputs, outputs, design goals 204, the existing circuit, and current and past circuits and their corresponding simulation data, in order to propose changes to the current circuit that will allow the circuit to better meet or exceed the design goals 204 provided. Particular embodiments of this system architecture and circuit CAD methodology are described below.

One may also note that the actions performed by classifier and predictor module 508 may also include the post-processing of data. In this regard, the prediction may include additional machine learning methodologies such as regression (see example below), or can be as simple as post-processing the classification results and possibly additional data gathered from the database 504.

Prediction Feedback into the User Interface

It is noted that once the predictions are made by the ML methodology, they can be presented to the user so that the user can choose to accept or reject them. As noted in the description of FIG. 4, the user may iterate their design as part of their workflow, and the prediction or proposal for a schematic 106 change feeds into the evaluation phase 202 in this workflow. The user needs to evaluate the proposals presented by the ML Module 300, and the user will choose whether to make use of the proposals or not. For example, if the ML Module 300 uses statistical inference and says that transistors made by manufacturer A are no good, and those made by B are better, the proposal could be a simple text-based message informing the user that out of X number of circuit and simulations, this was found to be the case, given their design goals and circuit properties. If the user agrees with that analysis, he/she may want to change to another manufacturer, and the UI could then propose that the user do this, for example by clicking a button that will automatically search the schematic and make the changes. This is just one embodiment of one type of ML methodology output that could be possible.

Another example, this time using meta-data from past circuits, would be if a user is designing a voltage amplifier circuit, and the user has op-amps in their design with positive feedback connections. The property of the circuit having positive feedback would be a meta-property of the circuit topology that the netlist analyzer 502 would determine, and something that the ML Module 300 might find is a poor design choice given their goals. The proposal might be, in this case, to ask the user if he/she would like to try negative feedback circuits, and general or specific examples could be shown to the user for review.

There are countless numbers of examples that could be provided here, since there are countless circuit topologies that exist. The point is that when the ML Module 300 runs a machine learning method and produces some useful proposals, the proposals need to be presented to the user in some form so the user can decide how to continue a subsequent design iteration. It is also conceivable that an application may have standard operation or optional setting that allows the system to automatically make changes to the schematic to apply any design choice that has a high probability of better meeting their goals.

Exemplary Embodiments

Embodiments of the invention do not prescribe any specific set of methods/implementations beyond what is necessary to describe the system depicted in FIG. 3, the workflow in FIG. 4 and the high-level ML Module 300 in FIG. 5 and their respective internal components. In particular, although the Learning and Prediction phases are described above, the Predictor phase may require a methodology to work, and one such embodiment is described here for clarity. In practice, it is so noted that any methodology that can perform the operations described above is sufficient and equivalent, and no particular implementation or embodiment is assumed or prescribed. In other words, the system depicted in FIGS. 3, 4, and 5 and the related functional and operational descriptions form the basis of embodiments of the invention, and any details internal to the components in those figures (such as simulation or netlist format, database type, etc.) are only present to illustrate specific embodiments or examples.

For exemplary purposes, a complete embodiment is given for the high level system architecture depicted in FIG. 3, the design workflow depicted in FIG. 4 and the ML Module 300 detail depicted in FIG. 5.

For an embodiment representing the overall system architecture represented by FIG. 3, consider a modern client-server electronic CAD system such as SPICY SCHEMATICS, offered by ISCHEMATICS LLC company in California, USA. Although FIG. 3 is a much simplified representation of the system architecture used in the SPICY application, it is still representative, and serves well as an exemplary embodiment. Considering the web version of the SPICY application, the client portion is the SPICY web application runs in a user's computer browser.

Figure 6:
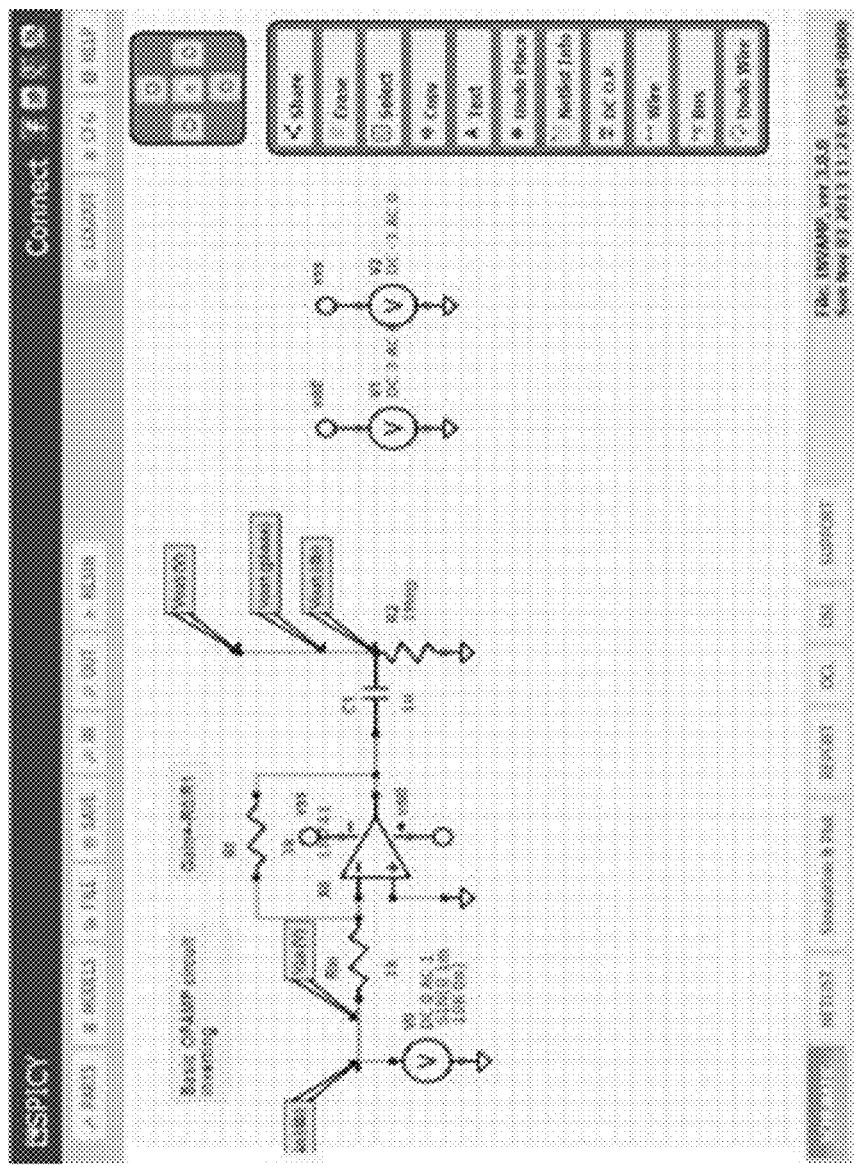
FIG. 6 illustrates a SPICY user interface in accordance with one or more embodiments of the invention.

The SPICY user interface is shown in FIG. 6. The user logs in online at a particular internet URL or web address, and the application loads into the browser.

The user creates a schematic using the user interface provided (the web application). When the user simulates their circuit, the application first automatically generates an updated netlist 112, and sends that netlist 112 to the simulator program 114 on the server for simulation. The client application 102 is written in standard web technologies such as HTML (Hyper Text Markup Language), CSS (Cascading Style Sheets), and JAVASCRIPT, and the server-side is similarly written in standard server scripting languages like PYTHON. The databases used are MYSQL and SQLITE.

Since the SPICY application today does not include any ML module 300, the design flow today follows as depicted in FIG. 2.

Note that when the client application 102 accesses the server software 108, it must do so through an application programming interface (API). SPICY's API interface allows the client to, for example, login the user, retrieve files, save files, send the schematic to the server for enlisting 110, send the netlist 112 to the simulator 114 for simulation, and other operations. The simulator 114 used in SPICY is NGSPICE and is accessed through custom server-side PYTHON software on standard LINUX servers. Once a user has simulated a circuit, the server sends back simulation result information 116 and the client application 102 plots the data.

Figure 7:
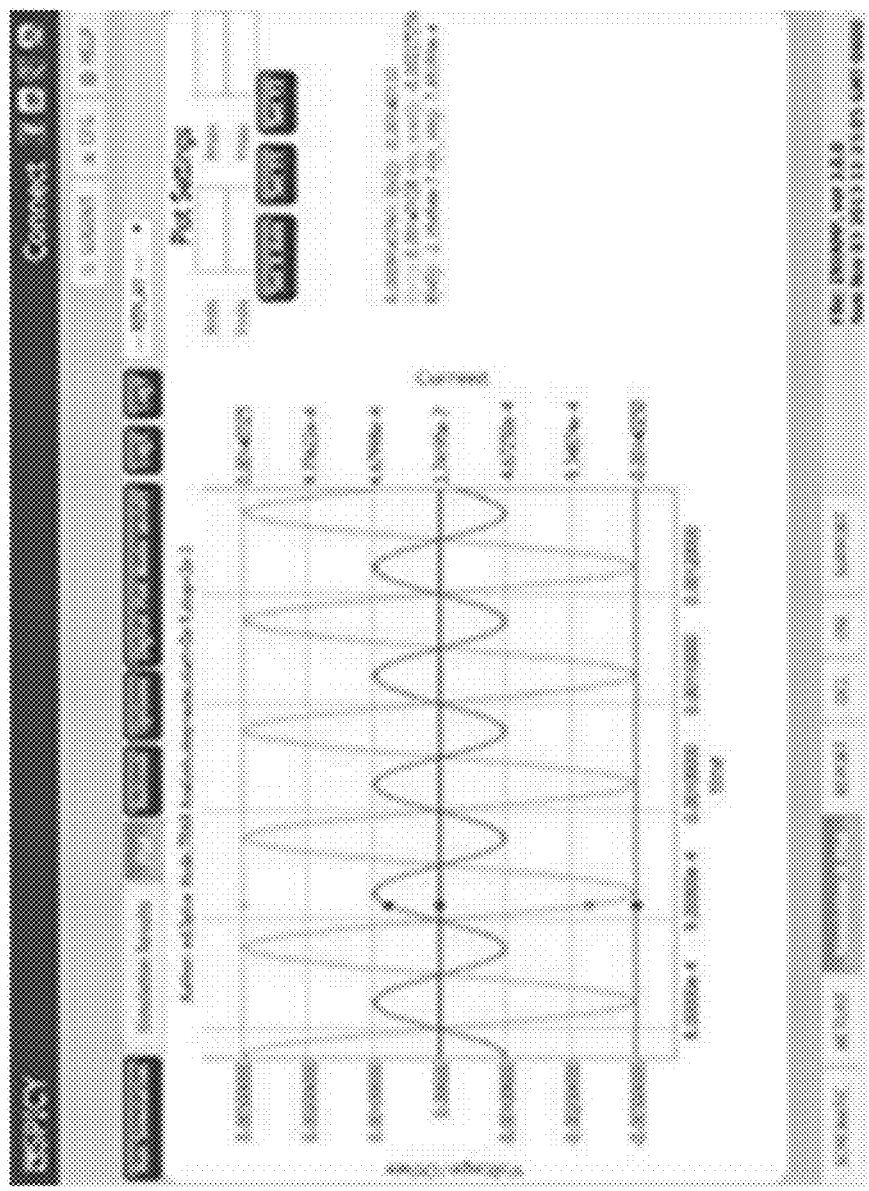
FIG. 7 shows a simulation result being plotted in the SPICY application in accordance with one or more embodiments of the invention.

FIG. 7 shows a simulation result 116 being plotted in the SPICY application. Although there may be some unique particulars on how the SPICY application is architected, including the number and purpose of its servers being used, and when and how data is transferred and in what form it is transmitted, it is likely that most of the modern client-server web based circuit CAD systems that use spice simulators work in a similar way.

Embodiments of the invention add a workflow including the ML Module 300 to this architecture. On the application side 102, the following may be added: (1) the ability for the user to specify design goals 204 within the UI 104; and (2) the ability to view and apply predictions made by the ML Module 300. On the server 108, the ML Module 300 and related interface modules are added. For the Learning Phase, each time a user simulates, the netlist 112, design goals 204, and simulation results 116 are sent to the ML Module 300 for processing. The netlist analyzer 502 and simulation results analyzer 506 run their methodologies, and insert data into the database 504.

The design goals 204 in embodiments of the invention may be chosen by the user using a simple multiple choice checkbox list, allowing the user to choose from pre-defined goals including minimization of circuit cost, size/area, power, or potential physical layout complexity.

The Classifier and Predictor 508 then automatically runs a check to see if there is enough data, and if the predictor 508 has enough confidence to predict and propose useful changes for the user to include in the user's evaluation phase of the design flow. If there is enough data, and the Predictor module 508 has some concrete proposals that can improve the user's circuit towards the user's design goals 204, the ML Module 300 will send back to the client the proposed changes. In such an embodiment, one may suppose there is only one simple method of displaying proposals to the user, namely, that of a simple popup message that conveys the information to the user regarding what schematic changes may be a potential benefit to them.

It is noted that a more complex system is envisioned where a the proposed schematic changes are visually overlaid on the current schematic with a different display style (different color or other attribute(s)), in such a way that it is clear to the user that it is a proposal and not part of the existing schematic. In such an embodiment, the user could easily move through different proposals generated by the system using a button, mouse click, key-press, finger tap, voice command, or any other input method deemed appropriate. In this way, the user can choose from multiple options visually, for example considering other factors while evaluating those options. For example, the user may choose to skip any suggestions that use a particular manufacturer, or a component type, or circuit topology style, if they have some reason (unknown to the system) to not use that type of circuit or part. Certainly filters can be added to the UI 104 to automate these types of selections.

In embodiments of the invention, one may consider the following list of attributes that will be extracted from the netlist analyzer 502:

1. Input types 502A (voltage or current, AC or DC or mixed, function used if any) and # inputs
2. Output type 502B (voltage or current) and # of outputs;
3. # of components in circuit 502C;
4. Type of each component 502C;
5. Value(s) of each component 502C;
6. Manufacturer of each component 502C;
7. Tolerance value for all passive components (if applicable) 502C;
8. Meta information about components 502C, such as whether associated or supplied models are ideal or simple models, or higher order models with non-idealities;
9. Circuit topology meta-information 502D, including:
    (a) Whether negative feedback is used;
    (b) Whether bootstrapping is used;
    (c) Whether op-amps are used;
    (d) Whether bipolar transistors are used;
    (e) Whether CMOS transistors are used;
    (f) Whether diodes are used;
    (g) Whether recognized logic circuit types are used (TTL, DTL, CMOS, other);
    (h) Whether recognized digital logic circuits are present (NAND, AND, NOR, OR, NOT, XOR, others);
    (i) Whether recognized bipolar transistor amplifier circuit topologies are used (Common-emitter, common-base, common-collector, other);
    (j) Whether recognized CMOS transistor amplifier circuit topologies are used (Common-source, common-gate, common-drain, other)
    (k) Whether recognized two-port networks are used (series-series, series-parallel, parallel-parallel, parallel-series, cascade, cascode);
    (l) Whether recognized feedback topologies are used in the circuit;
    (m) Whether the circuit can be generally considered a digital, analog, or mixed-signal circuit;
    (n) Whether the circuit can be considered an op-amp circuit;
    (o) Whether the circuit can be considered a low frequency (where physical and transmission line effects are not important) or high frequency circuit (where physical and transmission line effects are important);
    (p) Whether the circuit can be considered an RF circuit; and
    (q) Whether the circuit includes any antenna or radiating components.

All this information is analyzed at the time of netlisting 110, and combined with the design goal 204 selection, and entered into a database 504 (e.g., a relational database type where the main keys used are the user and the specific filename being analyzed) as a new record.

If simulation data 116 is available as well, the output signal information may be analyzed/characterized (e.g., by results analyzer 506), and entered into the database 504. Note that depending on the available computational capacity and the application needs, more signal processing can be carried out on the simulation results 116 themselves. In embodiments of the invention, one can assume that if the simulation run was a time domain simulation, that the time domain output signals are processed by frequency domain signal processing techniques, such as running a Fast Fourier Transform on the time data, to find out what frequency components are present in the time series signals. If a frequency domain simulation was run, an inverse FFT could be run on the frequency domain information, to extract time domain information from the simulation results 116.

Finally, in embodiments of the invention, one could assume that the ML Module 300 also initiates additional simulations to gather more information. For any given circuit, in fact, ideally, it is desired to gather information from running all types of simulations possible (given the simulator(s) used) for that circuit, over a range of simulation parameters. For example, if the simulator is SPICE-based, typically operating point (OP), transient (TRAN), frequency (AC), and noise analyses are possible and are standard simulation types available. In such a case, all of the simulations that were not specifically run by the user, would be run on the server 108 in the background, for additional data extraction for the ML Module 300.

For example, the user may create an analog signal amplifier, and might run the time domain simulation which shows the amplifier provides a gain of 10. In the background, the server 108 runs frequency analysis on the amplifier and finds additional information, namely, that the max gain of 10 is only valid between a specific range of input signal frequencies. This information may not be useful to the user who made the circuit, because the user may only be interested in one frequency, but when other users are designing similar circuits, it may be of interest to them that there exists this limitation.

During the Prediction Phase, the netlist 112, design goals 204, and simulation results 116 are input to the ML Module 300 and the Classifier and Predictor 508 are run on the server 108. In this case, suppose the predictor 508 uses a simple statistical inference engine to determine the attributes saved in the database 504, and for the design goals 204 and inputs and outputs, which of the circuit topology meta-descriptions were most typically present for designs that met or exceeded the goals 204. If out of 10,000 amplifier circuits for example, gains above 100 were statistically typically achieved with bipolar transistors, and the current circuit being analyzed is not classified as being a bipolar transistor circuit, then this could be a proposal to the user, that the user might want to try bipolar circuits to achieve more circuit gain. This type of inference analysis would be done on each of the circuit topology meta-information defined above, and for each design goal 204 chosen by the user.

As in FIG. 4, the user will use this proposed information when evaluating an existing design, and will decide whether to modify the schematic 106 or not, and to re-iterate by simulating again after making changes. The user will repeat the process of making schematic changes, simulating, and evaluating, until the user is satisfied with the schematic 106.

It is noted that this type of system may require orders of magnitude more processing and computation than a traditional system. It is further noted that it may require more time between simulations to be able to run the ML Module 300 tasks. How much processing, when it occurs, and how it affects the user may be dependent on specific implementation details. On the other hand, it is noted that the computation time required to arrive at a given proposal for a user is greatly reduced for that user, since, the data used in the predictions have been computed previously, distributed among all previous users who simulated similar circuits with similar design goals.

Representative Example

Embodiments of the invention may be implemented on a client-server CAD system written in JAVASCRIPT, HTML, and CSS programming languages (on the client side), and using PYTHON (for the server side). The databases used on the server side may be implemented using SQLITE. Further, the software for the ML module 300 may be written in PYTHON, and using the open-source machine learning library SCIKIT-LEARN.

As a representative example, one may consider a user of a circuit CAD system attempting to design a so-called "voltage-amplifier" type circuit. This is a common circuit that provides voltage "gain" such that the magnitude of the output voltage is equal to that of input voltage, multiplied by the circuit gain. In this example, the user has a primary design goal objective to achieve a gain of 100V/V as the input signal is passed to the output.

Figure 8:
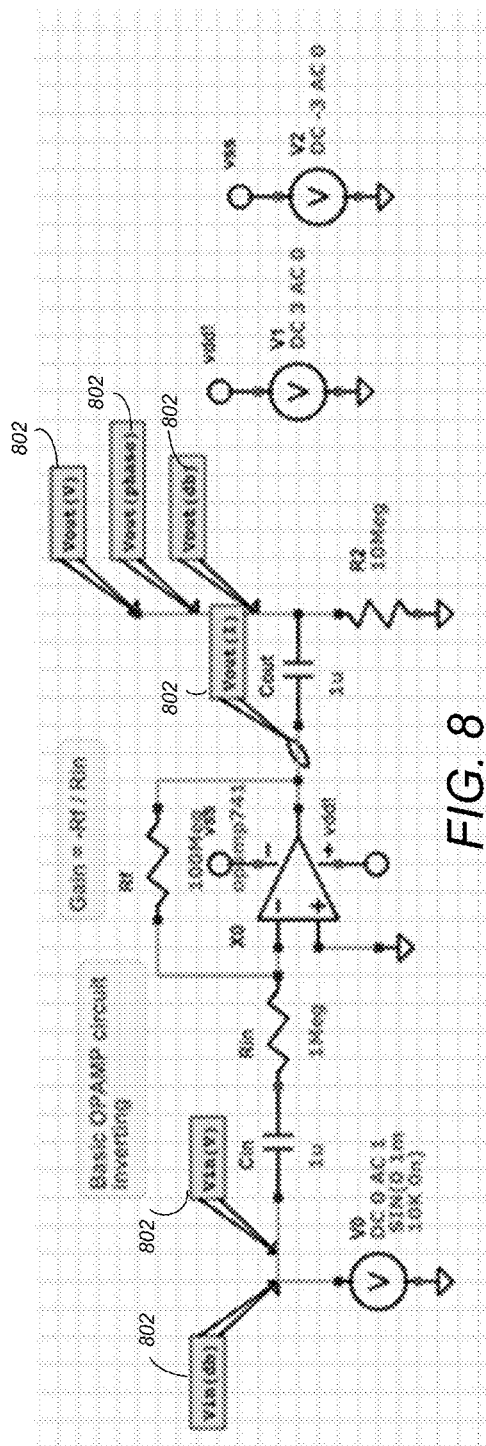
FIG. 8 illustrates an exemplary circuit schematic for a voltage amplifier type circuit in accordance with one or more embodiments of the invention.

FIG. 8 illustrates an exemplary circuit schematic for a voltage amplifier type circuit in accordance with one or more embodiments of the invention. The labels 802 denote (and inherently name) various circuit nodes, such as Vin and Vout, and the different types of probes allow for simulation output of various quantities (such as voltage, voltage in db, signal phase, current, etc).

In the example circuit of FIG. 8, there are two power supplies (V1 and V2), one input voltage source V0, one opamp type component X0, and various passive components (Cin, Rin, Rf). Cout and R2 represent the output load for the circuit. Note that here, the opamp part X0 uses a subcircuit model called opamp 741.

Figure 9:
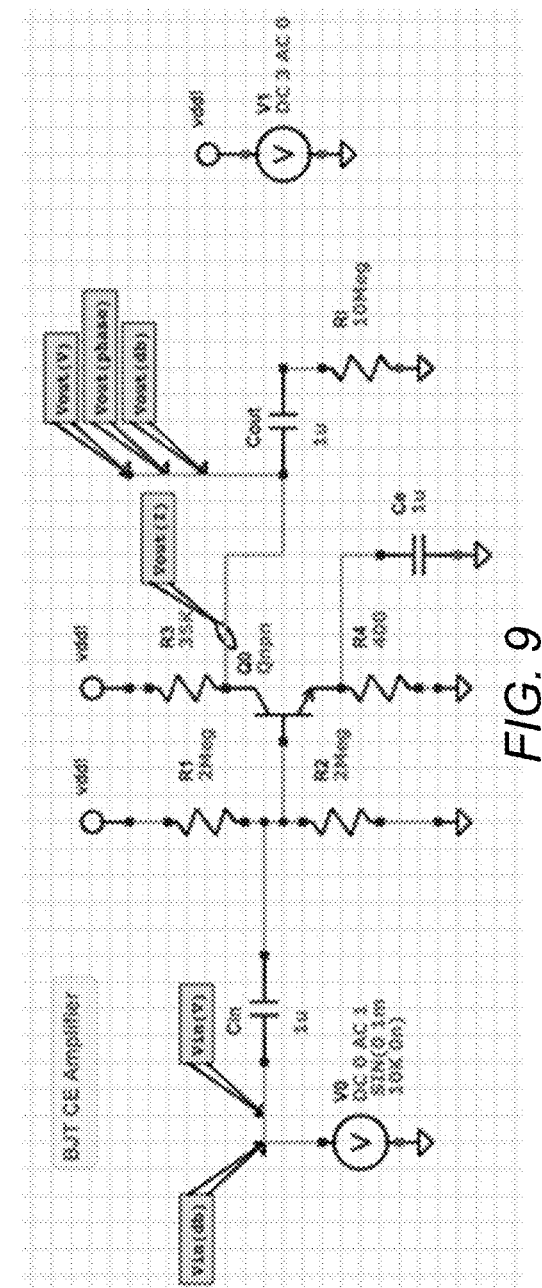
FIG. 9 illustrates a second version of a voltage amplifier in accordance with one or more embodiments of the invention.

FIG. 9 illustrates a second version of a voltage amplifier in accordance with one or more embodiments of the invention. This version has the same purpose as the circuit of FIG. 8, but instead of being based on an opamp component, this uses a so-called bipolar junction transistor (BJT) as the active component. The output load, the input source, and input capacitors are exactly the same as in the first circuit. The same signals are probed for simulation output, but note there is only one supply voltage (V1) in this circuit.

Figure 10:
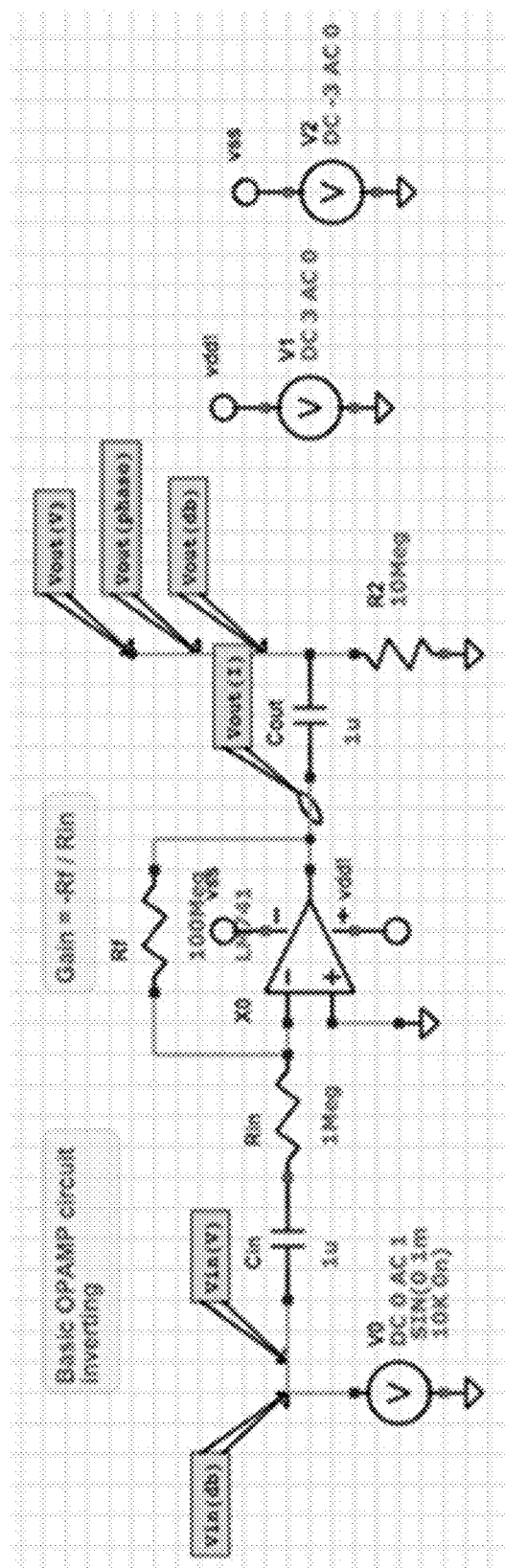
FIG. 10 illustrates a third example of a voltage amplifier in accordance with one or more embodiments of the invention.

FIG. 10 illustrates a third example of a voltage amplifier in accordance with one or more embodiments of the invention. FIG. 10 uses the same circuit as in FIG. 8, but uses a different opamp subcircuit model called LM741. Note that throughout the example of FIG. 10, one can make the assumption that subcircuits in a schematic represent integrated circuits (ICs), and so there is no concern about the details of the subcircuit models used, only whether different models are used for different circuits.

Circuit Design

The circuits of FIGS. 8 and 10 are examples of so-called "ac-coupled inverting opamp amplifier" circuits, and the circuit of FIG. 9 is a "BJT common-emitter amplifier" type circuit. These are very well-known circuits, with well-known gain equations, and one may assume here in all the example circuits, that the user has properly chosen the gain setting resistors (Rf/Rin for circuits in FIGS. 8 and 10, and R3/R4 in the circuit of FIG. 9) to match their primary design goal for a gain of 100V/V.

The tricky part for the designer is that there is of course more to the circuit operation that just the voltage gain, and even in the case of voltage gain, one has to consider the frequency range of operation. Certainly there are even more considerations that a designer should be concerned about, such as the DC operating point conditions, current draw, stability, # of components used (cost/area), circuit board complexity (discretes vs ICs, packaging, etc), and more.

Embodiments of the invention can learn from data, in order to provide useful predictions for the user in order to help the user meet their design goals.

Simulation Data

To simulate a database that contains data from multiple circuits and from large numbers of users, the 3 circuits (from FIGS. 8-10) were simulated thousands of times, while varying the gain setting resistors. The ratio of Rf to Rin and R3 to R4 was kept at the design goal of 100, but the magnitude of the individual values were varied. The 3 circuits were simulated 1000 times each, for a total of 3000 different circuits.

Such a simulation represents the very common case where a user remembers how to set the gain for the well-known circuit, but does not necessarily remember off-hand all the complexities of the circuit, and chooses the gain setting resistors using rules of thumb, or intuition as a start.

Unless detailed analysis is done on paper or otherwise, knowing the solution for the best trade-off considering all relevant factors is arguably impossible to know a priori. In addition, the designer may not have the time to perform all needed analysis to arrive at the most optimal solution. Add to this the fact that there may be new parts available to a user that he/she does not yet know about, and so in fact it is possible that the optimal solution cannot be known by the user unless they are otherwise introduced to the latest availability of new components.

Each of the 3 circuits were varied as described above to create 1000 variations for each, and run through an open-source SPICE-based circuit simulator (NGSPICE) using a frequency analysis configuration (AC analysis). All circuits were run using the same frequency range, so as not to bias the results.

Database Schema

In embodiment embodiments of the invention, the following database schema corresponds to what data were extracted and stored from the various submodules in FIG. 5:

The COMPS table keys off of the circuit identifier (CKTID), and the component reference from the schematic, and also stores each component's type, value, whether or not the component is a power supply, and the model name, if applicable. All components in the schematic have an entry in this table.

```
CREATE TABLE "COMPS" (
    'CKTID'         VARCHAR NOT NULL,
    'REF'   TEXT NOT NULL,
    'TYPE'          VARCHAR NOT NULL,
    'MODEL'         VARCHAR NOT NULL,
    'VALUE'         INTEGER NOT NULL,
    'isCktSupply'           INT(1) NOT NULL,
    'LAST_UPDATE'           DATETIME NOT NULL,
    PRIMARY KEY(CKTID,REF)
)
```

The INPUTS table stores information about circuit "inputs". These are assumed to be defined as being a voltage or current source, connected to a node in the circuit named "Vin". The DC, and AC value is stored, along with the schematic reference, component type, and information about source functions, if applicable.

```
CREATE TABLE "INPUTS" (
    'CKTID'             VARCHAR NOT NULL,
    'REF'   VARCHAR NOT NULL,
    'TYPE'              VARCHAR NOT NULL,
    'isVoltageSource'   INT(1) NOT NULL,
    'isCurrentSource'   INT(1) NOT NULL,
    'hasFunction'       INT(1) NOT NULL,
    'function'  VARCHAR NOT NULL,
```

```
        'function_spec'  VARCHAR,
        'DC'    VARCHAR NOT NULL,
        'AC'    VARCHAR NOT NULL,
        'LAST_UPDATE'   DATETIME NOT NULL,
        PRIMARY KEY(CKTID,REF,TYPE)
)
```

The SIMOUTPUTS table refers to those signals that were included in simulation output, either by the user placing probes on signals of interest, or by the application automatically outputting certain values. The type (voltage, current, voltage in db, etc), and target (node name or component name, if applicable) are saved. There is one entry per output signal.

```
CREATE TABLE "SIMOUTPUTS" (
        'CKTID'         VARCHAR NOT NULL,
        'TYPE'          VARCHAR NOT NULL,
        'TARGET'        VARCHAR NOT NULL,
        'LAST_UPDATE'   DATETIME NOT NULL,
        PRIMARY KEY(CKTID,TYPE,TARGET)
)
```

The SIMRESULTS table corresponds to post-processing of simulation data, and extraction of higher level information than only what was output by the simulator. In the case of a voltage in decibels (db), there is one entry per output variable, and low and high 3 db cutoff frequencies are detected starting from the frequency corresponding to the max value for that signal. In the case of a voltage, the min and max gain (referenced to the input denoted by REF_INPUT) is calculated, and there is one entry per OUTPUT/INPUT combination. These are directly chosen from the user's design goals, which in the case of 'voltage gain', must specify the relevant input and output variables.

```
CREATE TABLE "SIMRESULTS" (
        'CKTID'         INTEGER NOT NULL,
        'OUTNAME'       VARCHAR NOT NULL,
        'REF_INPUT'     VARCHAR,
        'VGAINMAX'      FLOAT,
        'VGAINMIN'      FLOAT,
        'BWL'   FLOAT,
        'BWH'   FLOAT,
        'LAST_UPDATE'   DATETIME NOT NULL,
        PRIMARY KEY(CKTID,OUTNAME,REF_INPUT)
)
```

The TOPOLOGIES table is an example of how one can extract data useful for categorizing and clustering circuits. For each type of valid circuit component, there is a Boolean value indicating whether or not that component exists at least once in the netlist for the circuit matching CKTID. The number of power supplies, and a measure of circuit size are also calculated and stored. The MODELSTR is an ordered list of all unique model or subcircuit names used in the netlist, concatenated to a string.

```
CREATE TABLE "TOPOLOGIES" (
        'CKTID'         VARCHAR NOT NULL,
        'has_C'         INT(1) NOT NULL,
        'has_B'         INT(1) NOT NULL,
        'has_E'         INT(1) NOT NULL,
        'has_D'         INT(1) NOT NULL,
        'has_G'         INT(1) NOT NULL,
        'has_F'         INT(1) NOT NULL,
        'has_I'         INT(1) NOT NULL,
        'has_H'         INT(1) NOT NULL,
        'has_K'         INT(1) NOT NULL,
        'has_J'         INT(1) NOT NULL,
        'has_M'         INT(1) NOT NULL,
        'has_L'         INT(1) NOT NULL,
        'has_O'         INT(1) NOT NULL,
        'has_Q'         INT(1) NOT NULL,
        'has_S'         INT(1) NOT NULL,
        'has_R'         INT(1) NOT NULL,
        'has_U'         INT(1) NOT NULL,
        'has_T'         INT(1) NOT NULL,
        'has_W'         INT(1) NOT NULL,
        'has_V'         INT(1) NOT NULL,
        'has_Y'         INT(1) NOT NULL,
        'has_X'         INT(1) NOT NULL,
        'has_Z'         INT(1) NOT NULL,
        'NUMSUPPLIES'   INTEGER NOT NULL,
        'CKTSIZE'       INTEGER NOT NULL,
        'MODELSTR'      VARCHAR NOT NULL,
        'LAST_UPDATE'   DATETIME NOT NULL,
        PRIMARY KEY(CKTID)
)
```

ML Module 300

The Machine Learning module 300 was developed following the same architecture as in FIG. 5. For each of the 3000 circuits simulated, and using the circuit netlist as input, the Machine Learning Module 300 first ran the Netlist Analyzer 502, which provided results from the INPUT 502A, OUTPUT 502B, COMPONENT 502C, and TOPOLOGY 502D characterization modules. Each submodule updated their respective database tables as they ran. Finally, the Results Analyzer 506 was run with input from the simulation results. All data was stored in the database 504 following the schema previously noted. This example only uses one type of design goal, that of voltage gain, but there are many more that can be of interest (such as current gain, transimpedance, transconductance, dc value and ripple voltage, oscillation frequency, etc).

In this example:
  The Input Analyzer/characterization module 502A counts and categorizes the inputs for the circuit.
  The Output Analyzer/characterization module 502B parses the print statement in the netlist 112 and categorizes and counts those signals that are marked to be output in the simulation results 116.
  The component analyzer/characterization module 502C parses the netlist 112 to find all valid SPICE elements, subcircuits, and sources.
  The Topology Analyzer/characterization module 502D attempts to extract qualitative information about the circuit. In this example, it is limited to how many and what types of components the circuit has, how many power supplies it has, and what models and subcircuits it uses.
  The Results Analyzer 506 finds the maximum and minimum values for all voltages and current, inputs and outputs, finds gain for each pair of output and input, and finds the bandwidth of all output voltages This can be extended to include more topological information, such as whether or not the circuit has: recognized common sub-circuits (for example a current limiter, regulator, or amplifier), recognized feedback topologies, or more.

Classifier and Predictor 508

One way to make a prediction is to look at other circuits that are very similar to the one in question, and see what could be done differently to make the circuit perform better.

An example here would be to see if changing the value of one of the components in a circuit could help, and if so, by what amount.

Another way to make a prediction is to look at circuits that are very different in some respect, but that have the same design goals and same number and type of inputs and outputs, but met the design goals better than the current circuit. An example here is changing a circuit's topology to achieve for stability, or changing a subcircuit model (change part selection) to achieve higher performance or lower cost.

In embodiments of the invention, the Classifier and Predictor module 508 first clusters the circuit data using the MeanShift clustering methodology with a bandwidth of 0.01. The features are the columns of the TOPOLOGIES table, and as there are no labels, this is an unsupervised methodology. The methodology expectedly finds that there are 3 types of circuits in the database 504 (the 3 example circuits of FIGS. 8-10), and for the current circuit of interest, it can tell what group it is most like. Out of 3 k circuits, not even one circuit was misclassified in this example. Note that this is unsupervised, clustering circuits together based on similarity (not equality) of features in the TOPOLOGY table. Indeed more complex examples can be built, and parameters tuned for best results. In alternative embodiments, the method may be tuned based on large sets of test cases.

Note that since a fixed number of samples would be desired in a live server-client system (for determinism and for efficiency), on may assume that the only database information retrieved for this run were those for circuits with the same design goals, and same number and type of inputs and outputs, and that were added in the past X amount of time. This can be easily achieved in a large-scale system by using a SQL query to pull the data set of interest.

In view of the above, the classification performed in this example (performed by the classifier and predictor module 508) may include a machine learning clustering methodology that utilizes database 504 data. Further, the prediction (performed by the classifier and predictor module 508) can refer to the aggregate data calculated (post-processed) using database 504 data for the clusters found.

Results

Now that one has determined which group a circuit is in and not in, the group can be examined as a whole and aggregate information can be used to make predictions.

In this example, the circuit of FIG. 8 achieves the gain with bandwidth having a maximum of about 10 khz. The circuit of FIG. 9 average bandwidth is much higher (10 Mhz), but with an unwanted high-pass response as well. The circuit 3 of FIG. 10 has slightly higher bandwidth compared to the circuit of FIG. 8. Note that the circuits of FIGS. 8 and 10 have a single subcircuit model and they are different, and the circuits of FIGS. 8 and 10 contain opamps and no other active elements, whereas the circuit of FIG. 9 contains BJT transistors, and the circuits of FIGS. 8 and 10 do not. Important to note is that even within a cluster, there are differences based on the component values.

For example, within cluster 1 (corresponding to the circuit of FIG. 8), all circuits achieve a design goal of gain >=95, the 3 db cutoff frequency for the variations within the cluster varies from 6 khz to 10 khz, depending on the value of the gain setting resistors. After clustering, and retrieving the min and max bandwidth for that cluster (and min and max opamp feedback resistor values for example), basic SQL statements can be run on the database to retrieve specific instances that one knows must exist, in order to retrieve the circuit specific values of components. In this way, it can be deduced and proposed to the user that within the same group of circuits like the one of interest, that without changing the circuit topology at all, lower/higher resistor values would be beneficial. In this case for the circuit of FIG. 8, it turns out that as the feedback resistor value ranges from 100 k to 100M (and the input resistor is accordingly kept to the ratio of 1/100 times that value), the bandwidth ranges from 10 khz to 10 Mhz. This knowledge is translated into a prediction for the user such that they would be urged to use a higher feedback resistor value (and corresponding input resistor value) to achieve the same gain but higher bandwidth. This is knowledge they would not otherwise have at hand, unless they had done the comparative studies, or manually calculated the bandwidth as well as the gain.

From this clustering result, enough information exists to present some basic predictions to the user. If a user working on the circuit of FIG. 8 does not mind changing their opamp part to another (and change the model they are using), and supposing the bill of materials cost in the circuit of FIG. 10 is lower than in the circuit of FIG. 8, this can be suggested to the user. Alternatively, if a user working on the circuit if FIG. 9 cannot live with the minimum frequency imposed by that circuit, they can switch to a different topology such as in the circuit of FIG. 8.

Note that embodiments of the invention enabled the progress from having basic information about a circuit, to being able to predict circuit changes for better performance, based solely on the data in the system. The alternative would be, for each user and circuit, to have to run hundreds or thousands of variations at design time, in order to achieve the same results. Using a proper sampling of data, the clustering methodology can run in seconds on already extracted data, as opposed to minutes or even hours in the case that all the data needs to be simulated and extracted at design time.

Extending this further, if one enhances the topology analyzer so that one can (after clustering) recognize subcircuit topologies, (for example being able to recognize the common-emitter amplifier in the netlist), then a regression analysis may be performed to see what, if any, parameters of that recognized circuit have the largest effect on the metric of interest.

In embodiments of the invention, it is intended that the extraction of circuit information and storage into the database, is done for any circuit after it has been simulated and has met the design goal for that circuit. This is to provide "positive examples" for the machine learning methods. In the case of clustering as described above, this is all that is needed, and one can see that actionable information is obtained.

If regression is desired, for example to adjust component values along a continuous scale, then, negative examples may be needed as well and data can be stored even when the circuit did not meet its design goal. It is noted that if the number of topology features and the number of samples becomes large, dimensionality reduction algorithms such as PCA or other may be used before clustering to reduce computation time in clustering.

Logical Flow

Figure 11:
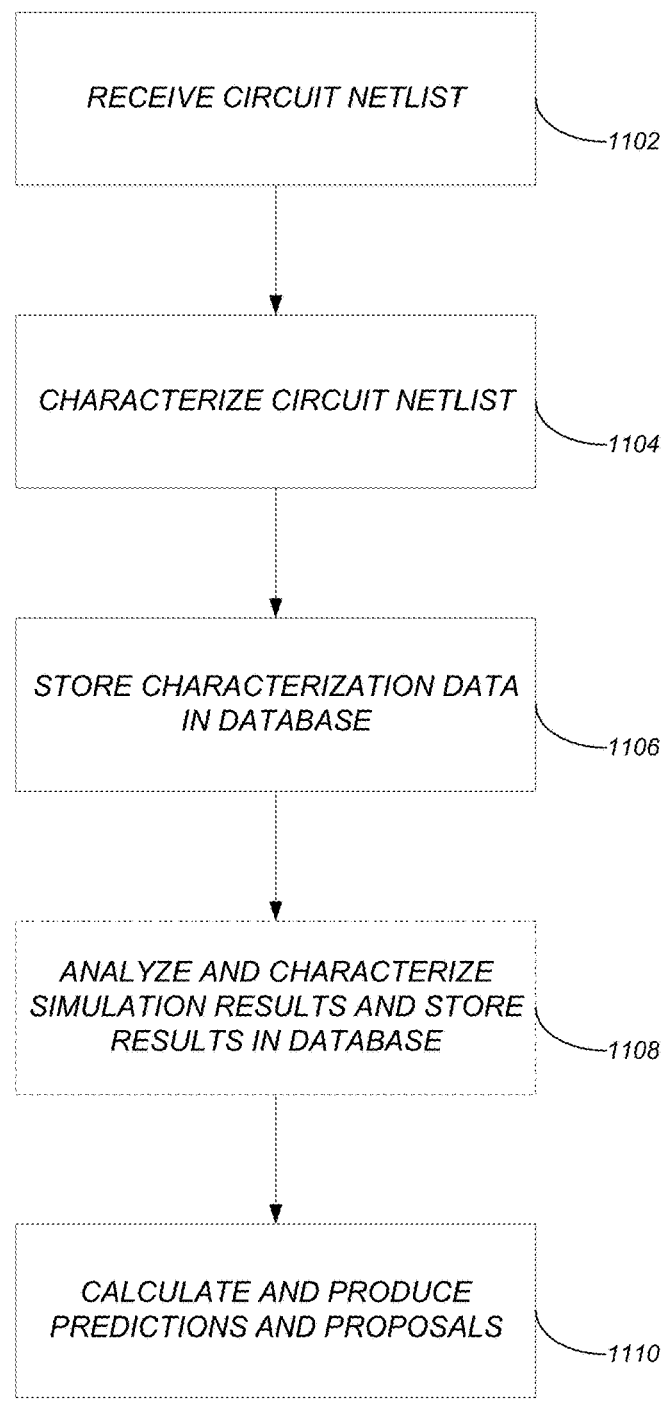
FIG. 11 illustrates the logical flow for designing an electronic circuit in accordance with one or more embodiments of the invention.

FIG. 11 illustrates the logical flow for designing an electronic circuit in accordance with one or more embodiments of the invention.

At step 1102, in a netlist analyzer program in a machine learning module program on an electronic computer aided design (CAD) environment server computing device connected to the Internet, a circuit netlist for a designed circuit is received from a user.

The generation of the circuit netlist may be conducted on a client CAD software application on an electronic CAD design environment client computing device that is connected to the Internet. In particular, the designed circuit may be designed in a user interface on the client. A netlisting software application, in the client CAD software application, may then be used to convert circuit schematic information received from the designed circuit into the circuit netlist. Circuit simulation software in the CAD client may then be used to simulate the designed circuit represented by the netlist to produce the simulation results. Such a process may be repeated on hundreds or thousands of clients for further processing and use by the server.

At step 1104, the circuit netlist is characterized in/by the netlist analyzer program. Such a characterization may be performed by multiple modules: an input characterization module may characterize input sources in the designed circuit; an output characterization module may characterize properties of outputs from the designed circuit; a component characterization module may characterize circuit components of the designed circuit based on one or more parameters; and a circuit topology characterization module may characterize a circuit topology of the designed circuit.

At step 1106, characterization data (produced by the netlist analyzer) is stored in a database. In this regard, characterization data from multiple users for multiple designed circuits is stored in the database. In other words, design information from multiple users are input, analyzed/characterized, and the resulting data is stored in the database.

Optional step 1108 may use a simulation results analyzer module/program (within the machine learning module) to analyze circuit simulation results, analyzing, in a simulation results analyzer program in the machine learning module, circuit simulation results. The output (i.e., the simulation output) from the circuit simulation results may be characterized and stored in the database.

At step 1110, predictions and proposals for the user to make design changes to the designed circuit in order to better meet or exceed design goals are calculated and produced. The predictions and proposals are based on design goal data, the current netlist and characterization data, and optionally current simulation results, and characterization data for multiple designed circuits, and simulation results, from the database. The design goal data may include universal goals such as (e.g., selected from a list consisting of) power, cost, performance, and size. Alternatively, or in addition, the design goals may by user-inputted goals specific to a design such as voltage gain and/or current limits.

As part of step 1110, the predictions and proposals may be received in the client CAD software application, where they are visually presented, via the user interface, to the user (e.g., by overlaying the proposed design changes over the designed circuit, in text form, or a combination of both).

Further to the above, optional processing may be performed before, after, or part of each of the steps 1102-1110 (e.g., before entering data into the database at step 1106, before running classification/regressions analysis in steps 1108, etc.).

Hardware Environment

The above descriptions provide the general modules and components used to implement embodiments of the invention. Below is a more detailed description of the general hardware/software components that may be used.

Figure 12:
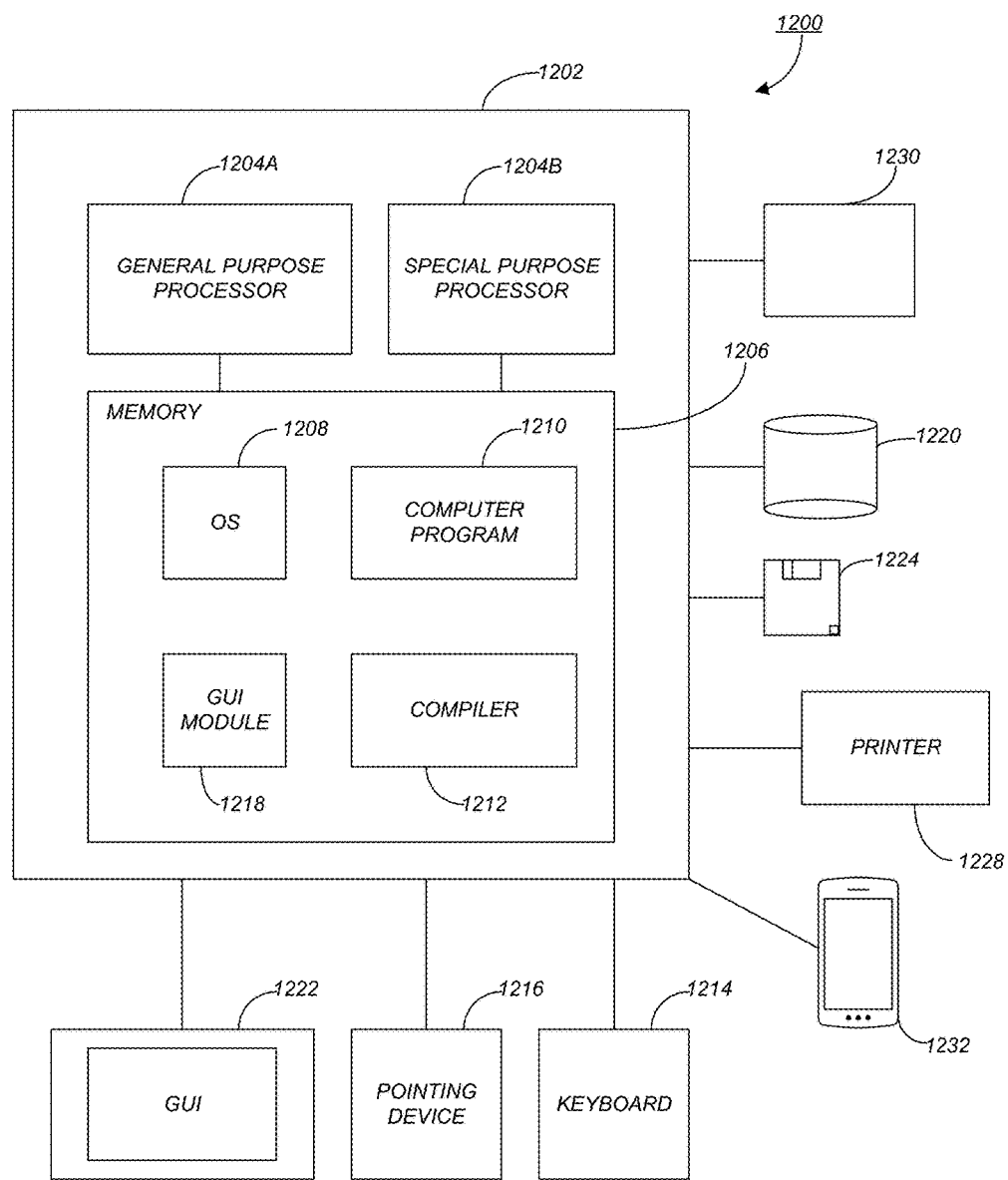
FIG. 12 is an exemplary hardware and software environment used to implement one or more embodiments of the invention.

FIG. 12 is an exemplary hardware and software environment 1200 used to implement one or more embodiments of the invention. The hardware and software environment includes a computer 1202 and may include peripherals. Computer 1202 may be a user/client computer, server computer, or may be a database computer. The computer 1202 comprises a general purpose hardware processor 1204A and/or a special purpose hardware processor 1204B (hereinafter alternatively collectively referred to as processor 1204) and a memory 1206, such as random access memory (RAM). The computer 1202 may be coupled to, and/or integrated with, other devices, including input/output (I/O) devices such as a keyboard 1214, a cursor control device 1216 (e.g., a mouse, a pointing device, pen and tablet, touch screen, multi-touch device, etc.) and a printer 1228. In one or more embodiments, computer 1202 may be coupled to, or may comprise, a portable or media viewing/listening device 1232 (e.g., an MP3 player, IPOD, NOOK, portable digital video player, cellular device, personal digital assistant, etc.). In yet another embodiment, the computer 1202 may comprise a multi-touch device, mobile phone, gaming system, internet enabled television, television set top box, or other internet enabled device executing on various platforms and operating systems.

In one embodiment, the computer 1202 operates by the general purpose processor 1204A performing instructions defined by the computer program 1210 under control of an operating system 1208. The computer program 1210 and/or the operating system 1208 may be stored in the memory 1206 and may interface with the user and/or other devices to accept input and commands and, based on such input and commands and the instructions defined by the computer program 1210 and operating system 1208, to provide output and results.

Output/results may be presented on the display 1222 or provided to another device for presentation or further processing or action. In one embodiment, the display 1222 comprises a liquid crystal display (LCD) having a plurality of separately addressable liquid crystals. Alternatively, the display 1222 may comprise a light emitting diode (LED) display having clusters of red, green and blue diodes driven together to form full-color pixels. Each liquid crystal or pixel of the display 1222 changes to an opaque or translucent state to form a part of the image on the display in response to the data or information generated by the processor 1204 from the application of the instructions of the computer program 1210 and/or operating system 1208 to the input and commands. The image may be provided through a graphical user interface (GUI) module 1218. Although the GUI module 1218 is depicted as a separate module, the instructions performing the GUI functions can be resident or distributed in the operating system 1208, the computer program 1210, or implemented with special purpose memory and processors.

In one or more embodiments, the display 1222 is integrated with/into the computer 1202 and comprises a multi-touch device having a touch sensing surface (e.g., track pod or touch screen) with the ability to recognize the presence of two or more points of contact with the surface. Examples of multi-touch devices include mobile devices (e.g., IPHONE, NEXUS S, DROID devices, etc.), tablet computers (e.g., IPAD, HP TOUCHPAD), portable/handheld game/music/video player/console devices (e.g., IPOD TOUCH, MP3 players, NINTENDO 3DS, PLAYSTATION PORTABLE, etc.), touch tables, and walls (e.g., where an image is projected through acrylic and/or glass, and the image is then backlit with LEDs).

Some or all of the operations performed by the computer 1202 according to the computer program 1210 instructions may be implemented in a special purpose processor 1204B. In this embodiment, the some or all of the computer program 1210 instructions may be implemented via firmware instructions stored in a read only memory (ROM), a programmable read only memory (PROM) or flash memory within the special purpose processor 1204B or in memory 1206. The special purpose processor 1204B may also be hardwired through circuit design to perform some or all of the operations to implement the present invention. Further, the special purpose processor 1204B may be a hybrid processor, which includes dedicated circuitry for performing a subset of functions, and other circuits for performing more general functions such as responding to computer program 1210 instructions. In one embodiment, the special purpose processor 1204B is an application specific integrated circuit (ASIC).

The computer 1202 may also implement a compiler 1212 that allows an application or computer program 1210 written in a programming language such as C, C++, Assembly, SQL, PYTHON, PROLOG, MATLAB, RUBY, RAILS, HASKELL, or other language to be translated into processor 1204 readable code. Alternatively, the compiler 1212 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 1210 accesses and manipulates data accepted from I/O devices and stored in the memory 1206 of the computer 1202 using the relationships and logic that were generated using the compiler 1212.

The computer 1202 also optionally comprises an external communication device such as a modem, satellite link, Ethernet card, or other device for accepting input from, and providing output to, other computers 1202.

In one embodiment, instructions implementing the operating system 1208, the computer program 1210, and the compiler 1212 are tangibly embodied in a non-transitory computer-readable medium, e.g., data storage device 1220, which could include one or more fixed or removable data storage devices, such as a zip drive, floppy disc drive 1224, hard drive, CD-ROM drive, tape drive, etc. Further, the operating system 1208 and the computer program 1210 are comprised of computer program 1210 instructions which, when accessed, read and executed by the computer 1202, cause the computer 1202 to perform the steps necessary to implement and/or use the present invention or to load the program of instructions into a memory 1206, thus creating a special purpose data structure causing the computer 1202 to operate as a specially programmed computer executing the method steps described herein. Computer program 1210 and/or operating instructions may also be tangibly embodied in memory 1206 and/or data communications devices 1230, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 1202.

Figure 13:
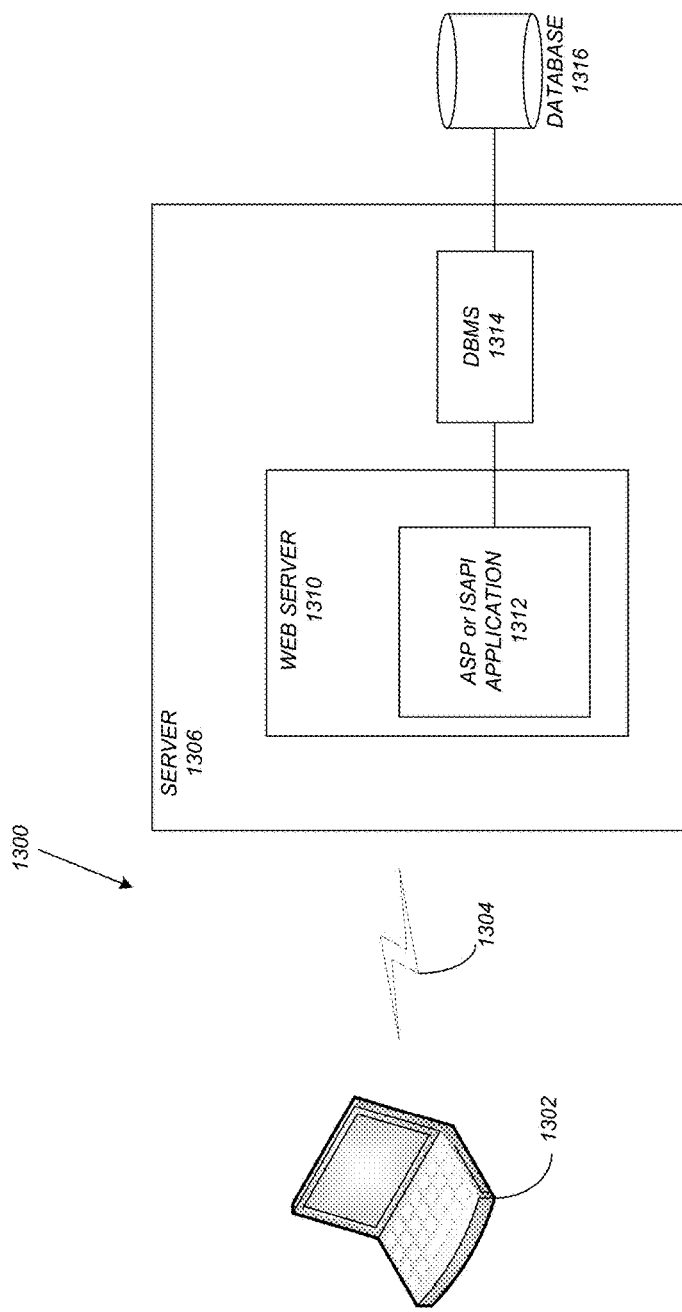
FIG. 13 schematically illustrates a typical distributed/cloud-based computer system using a network to connect client computers to server computers in accordance with one or more embodiments of the invention.

FIG. 13 schematically illustrates a typical distributed/cloud-based computer system 1300 using a network 1304 to connect client computers 1302 to server computers 1306. A typical combination of resources may include a network 1304 comprising the Internet, LANs (local area networks), WANs (wide area networks), SNA (systems network architecture) networks, or the like, clients 1302 that are personal computers or workstations (as set forth in FIG. 12), and servers 1306 that are personal computers, workstations, minicomputers, or mainframes (as set forth in FIG. 12). However, it may be noted that different networks such as a cellular network (e.g., GSM [global system for mobile communications] or otherwise), a satellite based network, or any other type of network may be used to connect clients 1302 and servers 1306 in accordance with embodiments of the invention.

A network 1304 such as the Internet connects clients 1302 to server computers 1306. Network 1304 may utilize ethernet, coaxial cable, wireless communications, radio frequency (RF), etc. to connect and provide the communication between clients 1302 and servers 1306. Further, in a cloud-based computing system, resources (e.g., storage, processors, applications, memory, infrastructure, etc.) in clients 1302 and server computers 1306 may be shared by clients 1302, server computers 1306, and users across one or more networks. Resources may be shared by multiple users and can be dynamically reallocated per demand. In this regard, cloud computing may be referred to as a model for enabling access to a shared pool of configurable computing resources.

Clients 1302 may execute a client application or web browser and communicate with server computers 1306 executing web servers 1310. Such a web browser is typically a program such as MICROSOFT INTERNET EXPLORER, MOZILLA FIREFOX, OPERA, APPLE SAFARI, GOOGLE CHROME, etc. Further, the software executing on clients 1302 may be downloaded from server computer 1306 to client computers 1302 and installed as a plug-in or ACTIVEX control of a web browser. Accordingly, clients 1302 may utilize ACTIVEX components/component object model (COM) or distributed COM (DCOM) components to provide a user interface on a display of client 1302. The web server 1310 is typically a program such as MICROSOFT'S INTERNET INFORMATION SERVER.

Web server 1310 may host an Active Server Page (ASP) or Internet Server Application Programming Interface (ISAPI) application 1312, which may be executing scripts. The scripts invoke objects that execute business logic (referred to as business objects). The business objects then manipulate data in database 1316 through a database management system (DBMS) 1314. Alternatively, database 1316 may be part of, or connected directly to, client 1302 instead of communicating/obtaining the information from database 1316 across network 1304. When a developer encapsulates the business functionality into objects, the system may be referred to as a component object model (COM) system. Accordingly, the scripts executing on web server 1310 (and/or application 1312) invoke COM objects that implement the business logic. Further, server 1306 may utilize MICROSOFT'S TRANSACTION SERVER (MTS) to access required data stored in database 1316 via an interface such as ADO (Active Data Objects), OLE DB (Object Linking and Embedding DataBase), or ODBC (Open DataBase Connectivity).

Generally, these components 1300-1316 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 1302 and 1306 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 1302 and 1306. Embodiments of the invention may be implemented as a software application on a client 1302 or server computer 1306. Further, as described above, the client 1302 or server computer 1306 may comprise a thin client device or a portable device that has a multi-touch-based display.

Conclusion

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

In summary, embodiments of the invention provide a client-server electronic design automation (EDA) circuit design system with many thousands of users contributing data. The design system relies on design goals (e.g., universal goals such as power, cost, performance, and size)(e.g., user-inputted goals specific to their design such as voltage gain, current limits, etc.). In addition, embodiments of the invention includes a machine learning module on the server-side. The machine learning module takes input from a schematic, netlist, simulation output, and design goals, and the evaluation phase is informed by simulation output, (formal) design goals, and the machine learning module output. The machine learning module includes a netlist analyzer, simulation result analyzer, some form of database, and the classification and prediction blocks. The system takes input of a netlist, design goals, simulation results, and feeds back its output to the user interface. Overall, a operation may be viewed as a learning phase and prediction phase. In the learning phase, design information is taken from potentially thousands of users in order to run machine learning methods to find relationships between the inputs and outputs. During the prediction phase, predictions are presented to the current user in the form of design choices the user can take to meet a specific set of design goals. The predictions/design choices are presented visually using graphics (e.g., by overlaying a new circuit schematic design over the user's current design), text, or a combination of both.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A predictive electronic circuit design system comprising:
   (a) an electronic computer aided design (CAD) environment server computing device connected to the Internet, wherein the server computing device comprises a machine learning module program that comprises:
      (1) a netlist analyzer program that receives a circuit netlist for a designed circuit from a user, characterizes the circuit netlist, and sends characterization data to a database, wherein the characterization data comprises meta-information about the designed circuit;
      (2) the database, wherein characterization data from multiple users for multiple designed circuits are stored in the database; and
      (3) a classifier and predictor program that uses, from the database, design goal data, the characterization data for multiple designed circuits from the multiple users, and simulation results, to calculate and produce predictions and proposals for the user to make design changes to the designed circuit in order to better meet or exceed design goals; and
   (b) an electronic CAD design environment client computing device that is connected to the Internet, wherein the client computing device comprises;
      (1) a client CAD software application with a user interface that allows a user to design the designed circuit in the client CAD software application;
      (2) a netlisting software application that converts circuit schematic information received from the designated circuit into the circuit netlist; and
      (3) a circuit simulation software application that simulates the designed circuit represented by the circuit netlist to produce the simulation results; and wherein the designed circuit is output for fabricate of the design circuit.

2. The predictive electronic circuit design system of claim 1, wherein the netlist analyzer comprises:
   an input characterization module that characterizes input sources in the designed circuit;
   an output characterization module that characterizes properties of outputs from the designed circuit;
   a component characterization module that characterizes circuit components of the designed circuit based on one or more parameters; and
   a circuit topology characterization module that characterizes a circuit topology of the designed circuit.

3. The predictive electronic circuit design system of claim 1, wherein the machine learning module further comprises:
   a simulation results analyzer program that analyzes circuit simulation results and characterizes simulation output from the circuit simulation results and sends the simulation output characterization to the database.

4. The predictive electronic circuit design system of claim 1, wherein the design goals comprise universal goals selected from a list consisting of:
   power;
   cost;
   performance; and
   size.

5. The predictive electronic circuit design system of claim 1, wherein the design goals comprise user-inputted goals specific to a design comprising criteria exhibited by an output of a simulation of the designed circuit.

6. The predictive electronic circuit design system of claim 1, wherein:
the client CAD software application receives proposed design changes from the classifier and predictor program;
the user interface visually presents the proposed design changes to the user by overlaying the proposed design changes over the designed circuit.

7. The predictive electronic circuit design system of claim 1, wherein:
the client CAD software application receives proposed design changes from the classifier and predictor program;
the user interface visually presents the proposed design changes to the user in text form.

8. The predictive electronic circuit design system of claim 1, wherein:
the circuit netlist received by the netlist analyzer program comprises an enhanced netlist; and
the enhanced netlist comprises a text representation of a schematic of the designed circuit plus additional schematic information.

9. A computer-implemented method designing an electronic circuit, comprising:
receiving, in a netlist analyzer program in a machine learning module program on an electronic computer aided design (CAD) environment server computing device connected to the Internet, a circuit netlist for a designed circuit from a user;
characterizing, in the netlist analyzer program, the circuit netlist, wherein the characterizing generates characterization data, and wherein the characterization data comprises meta-information about the designed circuit;
storing the characterization data in a database, wherein characterization data from multiple users for multiple designed circuits are stored in the database;
calculating and producing predictions and proposals for the user to make design changes to the designed circuit in order to better meet or exceed design goals, wherein the predictions and proposals are based on design goal data, the characterization data for multiple designed circuits from the multiple users, and simulation results, from the database;
designing, in a user interface on a client CAD software application on an electronic CAD design environment client computing device that is connected to the Internet, the designed circuit;
converting, in a netlisting software application in the client CAD software application, circuit schematic information received from the designed circuit into the circuit netlist;
simulating, in a circuit simulation software application in the client CAD software; application, the designed circuit represented by the circuit netlist to produce the simulation results; and
wherein the designed circuit is output for fabricate of the design circuit.

10. The computer-implemented method of claim 9, further comprising:
characterizing, in an input characterization module in the netlist analyzer, input sources in the designed circuit;
characterizing, in an output characterization module in the netlist analyzer, properties of outputs from the designed circuit;
characterizing, in a component characterization module in the netlist analyzer, circuit components of the designed circuit based on one or more parameters; and
characterizing, in a circuit topology characterization module in the netlist analyzer, a circuit topology of the designed circuit.

11. The computer-implemented method of claim 9, further comprising:
analyzing, in a simulation results analyzer program in the machine learning module, circuit simulation results;
characterizing simulation output from the circuit simulation results; and
storing the simulation output characterization in the database.

12. The computer-implemented method of claim 9, wherein the design goals comprise universal goals selected from a list consisting of:
power;
cost;
performance; and
size.

13. The computer-implemented method of claim 9, wherein the design goals comprise user-inputted goals specific to a design comprising criteria exhibited by an output of a simulation of the designed circuit.

14. The computer-implemented method of claim 9, further comprising:
receiving, in the client CAD software application, proposed design changes from the classifier and predictor program;
visually presenting, via the user interface, the proposed design changes to the user by overlaying the proposed design changes over the designed circuit.

15. The computer-implemented method of claim 9, further comprising:
receiving, in the client CAD software application, proposed design changes from the classifier and predictor program;
visually presents, via the user interface, the proposed design changes to the user in text form.

16. The computer-implemented method of claim 9, wherein:
the circuit netlist received by the netlist analyzer program comprises an enhanced netlist; and
the enhanced netlist comprises a text representation of a schematic of the designed circuit plus additional schematic information.

* * * * *